(12) United States Patent
Hwu et al.

(10) Patent No.: US 6,259,713 B1
(45) Date of Patent: Jul. 10, 2001

(54) LASER BEAM COUPLER, SHAPER AND COLLIMATOR DEVICE

(75) Inventors: Ruey-Jen Hwu; XuDong Wang, both of Salt Lake City, UT (US)

(73) Assignee: The University of Utah Research Foundation, Salt Lake City, UT (US)

( * ) Notice: Subject to any disclaimer, the term of this patent is extended or adjusted under 35 U.S.C. 154(b) by 0 days.

(21) Appl. No.: 09/256,379

(22) Filed: Feb. 24, 1999

Related U.S. Application Data

(63) Continuation-in-part of application No. 08/990,375, filed on Dec. 15, 1997, now Pat. No. 5,995,289.

(51) Int. Cl.[7] .............................. H01S 5/024; H01S 5/022
(52) U.S. Cl. .............................. 372/36; 372/50; 372/109
(58) Field of Search .................................. 372/50, 36, 109

(56) References Cited

U.S. PATENT DOCUMENTS

| | | |
|---|---|---|
| 3,290,539 | 12/1966 | Lamorte ........................... 313/114 |
| 3,686,543 * | 8/1972 | Nyul ..................................... 372/44 |
| 4,477,730 | 10/1984 | Fukuda . |
| 4,716,568 | 12/1987 | Scifres et al. . |
| 4,718,070 * | 1/1988 | Liau et al. ........................... 372/50 |
| 5,040,187 | 8/1991 | Karpinski . |
| 5,128,951 | 7/1992 | Karpinski . |
| 5,166,755 | 11/1992 | Gat . |
| 5,222,088 | 6/1993 | Amano . |
| 5,284,790 | 2/1994 | Karpinski . |
| 5,311,530 | 5/1994 | Wagner et al. . |
| 5,311,535 | 5/1994 | Karpinski . |
| 5,325,384 | 6/1994 | Herb et al. . |
| 5,333,077 | 7/1994 | Legar et al. . |
| 5,343,489 | 8/1994 | Wangler ................................ 372/93 |
| 5,355,388 | 10/1994 | Lang ...................................... 372/99 |
| 5,526,373 | 6/1996 | Karpinski . |
| 5,572,542 | 11/1996 | Dixon . |
| 5,574,740 | 11/1996 | Hargis et al. . |
| 5,576,752 | 11/1996 | Kovacs et al. . |
| 5,594,591 | 1/1997 | Yamamoto et al. . |
| 5,610,759 | 3/1997 | Delacourt et al. . |
| 5,610,934 | 3/1997 | Zarrabi . |
| 5,615,042 | 3/1997 | Delacourt et al. . |
| 5,627,850 | 5/1997 | Irwin et al. . |
| 5,631,918 | 5/1997 | Kovacs et al. . |
| 5,644,584 | 7/1997 | Nam et al. . |
| 5,668,825 | 9/1997 | Karpinski . |
| 5,907,404 | 5/1999 | Marron et al. . |
| 5,995,289 | 11/1999 | Hwu et al. ........................... 359/627 |

OTHER PUBLICATIONS

W.A. Clarkson and D.C. Hanna, "Two–Mirror Beam–Shaping Technique for High–Power Diode Bars," Optics Letters, vol. 21, No. 6, pp. 375–377, Mar. 15, 1996.

* cited by examiner

Primary Examiner—James W. Davie
(74) Attorney, Agent, or Firm—Workman, Nydegger & Seeley

(57) ABSTRACT

An apparatus for providing improved high power laser beams. An elongated reflector with a highly-reflective surface is utilized with a laser beam emitter, such as a broad area diode laser, a diode laser bar, or a diode laser array. The laser beams reflect off of the highly-reflective surface which is curved substantially parabolically. The reflected beams are collimated or otherwise shaped and/or coupled by manipulation of the size and shape of the elongated reflector and the placement of the laser beam emitter in association therewith. A system of lenses or mirrors may be used in conjunction with the reflecting apparatus to achieve enhanced beam quality. One-dimensional and two-dimensional laser arrays can also be fabricated utilizing a substrate containing laser beam emitters in communication with one or more grooves formed in the substrate, with parabolic reflecting surfaces formed in the grooves or with optical reflector members placed in the grooves.

65 Claims, 14 Drawing Sheets

LASER BEAM COUPLER, SHAPER AND COLLIMATOR DEVICE

RELATED APPLICATION

The present application is a continuation-in-part of application Ser. No. 08/990,375, which was filed on Dec. 15, 1997, now U.S. Pat. No. 5,995,289, and which is incorporated herein by reference.

BACKGROUND OF THE INVENTION

2. The Field of the Invention

The present invention is related generally to apparatus for improving laser technology. More specifically, the present invention is related to apparatus for improving the beam quality of semiconductor diode lasers, broad area diode lasers, diode laser bars, and diode laser arrays.

3. The Relevant Technology

A laser is a device which utilizes the transitions between energy levels of atoms or molecules to amplify or generate light. When an electron makes a transition from a higher energy level to a lower energy level, a photon, the elementary quantity of radiant energy, is emitted. In what is referred to as "stimulated emission," an incoming photon stimulates an electron to change energy levels, which amplifies the number of exiting photons. In fact, this is the origin of the term laser: light amplification by the stimulated emission of radiation. The emitted photon travels in the same direction and is in the same phase as the incoming photon. When the stimulated emission in a laser involves only a single pair of energy levels, the resultant output beam has a single frequency or wavelength and is thus approximately monochromatic.

As laser technology has progressed, semiconductor lasers such as semiconductor laser diodes have been developed which can be used in a wide variety of applications. Semiconductor lasers are particularly useful for several reasons: they are capable of generating coherent radiation in the wavelength range which is particularly useful for optical fiber communications; they are relatively easy to fabricate and less costly than conventional, larger gas lasers; and they have a compact size which is useful in many applications including optical fiber communications, printing, and medical treatments.

One example of a semiconductor laser is a broad area laser diode. The "broad area" refers to the junction plane from whence the laser radiation originates. Most broad area semiconductor lasers comprise a "stripe" geometry. The stripe geometry typically has dimensions of about 50 to about 500 $\mu$m in width, about 1 mm in length, and about 1 $\mu$m in thickness. There are several advantages with respect to this geometry. There is improved response time due to small junction capacitance. Further, the thin active layer which is the area wherein the laser radiation is generated and confined, contributes to a smaller cross-sectional area. This reduces the operating current, which is necessary for sustained operation of the laser, and also reduces the threshold current, which is the current required to induce a laser device to commence lasing action.

Nevertheless, the laws of diffraction dictate that beam divergence, which is not desirable, will greatly increase with decreasing aperture size in a semiconductor laser. Yet, most applications require a small beam with maximum power in the smallest area possible. Increasing the width of the aperture does not help, because not only does it reduce the power per area of the emitted beam, it has been demonstrated that the modal characteristics are significantly degraded as the aperture width is increased past a certain point. As this width is increased, the mode degrades from a single, good quality Gaussian intensity profile, to several filaments of the beam spread over a large area.

Attempts have been made to increase the power with respect to semiconductor lasers by combining multiple laser diodes into what is termed a laser diode "bar" or "array." For example, a laser diode bar is typically made of multiple laser diodes that are aligned together for emitting multiple beams. A laser diode array is typically made of multiple laser diodes or laser diode bars which are combined in a stacked or layered configuration. The advantage of constructing laser diode bars or arrays is that the overall output power can be increased by phase locking several diode lasers together such that they operate as a single source. Yet, even though the power does increase when multiple lasers are combined to produce multiple beams, the quality is extremely poor. In turn, users are forced to spend increased time and money in attempting to alleviate the poor laser quality of the laser arrays, with less than ideal results.

In addition, achieving the desired mode control and coherence from laser arrays has proved difficult. As a result, virtually all the high-power arrays commercially available emit their radiation into two broad far-field lobes instead of a single diffraction-limited lobe.

Over the last decade there has been a tremendous amount of research effort spent in designing and fabricating high power laser arrays with adequate modal control and degree of coherence. Commercially available diode laser arrays have been available for the last few years which utilize stacked configurations of bars of laser diodes which lie in the grooves of a planar substrate containing a heat sink for the device. These stacked diode bars use a technology which is built upon "rack and stack" configurations. See, e.g., U.S. Pat. Nos. 5,311,535 and 5,526,373 to Karpinski, both of which are incorporated herein by reference.

Yet, the use of diode laser bars in this stacked design has many disadvantages. For example, this stacked design is inflexible and limited to a planar configuration. In addition, each diode laser bar, typically including more than twenty individual laser diodes, is pumped as an integral unit and individual laser diodes cannot be pumped or replaced separately. If even one diode laser inside the laser bar is damaged, the entire bar must be replaced. Unfortunately, replacement of one laser diode array containing only one diode laser bar is expensive.

Furthermore, the emitted laser beams from laser diode arrays experience significant divergence. This problem is addressed in U.S. Pat. No. 5,311,535, and in U.S Pat. No. 5,668,825 to Karpinski, the disclosure of which is incorporated herein by reference. Specifically, individual lenses are placed at a predetermined distance with respect to each diode laser. The radiation emitted from each diode laser passes through a lens which collimates the laser beam. Such a system requires the fabrication of multiple microlenses and the accurate placement of each, which complicates the manufacturing process thereby raising the overall cost of the system. Furthermore, any misalignments in the placement of the lenses greatly reduces the efficiency of the system, yet adjustments in alignment are extremely difficult. This system at its best is able to convert electrical power into optical power at an efficiency of about 50%.

In U.S. Pat. No. 5,333,077 to Legar, the disclosure of which is incorporated herein by reference, an alternative solution is suggested to the problem of diverging emission, which comprises a combination of aperture filling and geometrical transformation, and requires two optical elements. The first optical element is a linear array of lenses, each of which receives and redirects a different portion of the emission from the diode array. The second optical element is a separate two-dimensional array of lenses located at the imaginary plane and aligned with the two-dimensional pattern of light beams thereby redirecting and focusing the two dimensional pattern of light beams to the focal point. The second array of lenses can be placed in a rectangular or a hexagonal close packed geometrical pattern. The lenses in both arrays are diffractive lenses.

Although the efficiency could in theory approach approximately 99%, the fabrication of these diffractive lens arrays with the appropriate profiles is difficult, time consuming, and costly. This is due in particular to the complex mask and etch technique commonly used in integrated circuit fabrication. Masks must be made and etching must be done at each step. Thus, for a lens of m levels, there must be P master masks made and P etching steps performed, where $m=2^P$. In addition to the fabrication constraints, the alignment of the microlens arrays must be very precise with respect to each other and with respect to the diode array.

SUMMARY AND OBJECTS OF THE INVENTION

It is therefore a feature of the present invention to provide small and inexpensive high power lasers with improved laser beam quality.

It is still another object of the present invention to provide control of the divergence of laser beams from broad area diode lasers, laser diode bars, and laser diode arrays.

Another object of the present invention is to provide improved apparatus for collimating, coupling, and shaping laser beams.

Yet another object of the present invention is to provide improved diode pumped solid state laser systems and harmonic generation laser systems for producing green, blue, and ultraviolet light.

To achieve the foregoing objects, and in accordance with the invention as embodied and broadly described herein, the present invention relates to a new and useful apparatus for improving the beam quality of high power lasers and particularly broad area diode lasers, laser diode bars, and laser diode arrays.

Specifically, the present invention is directed to an apparatus for collimating, shaping and/or coupling laser beams emitted from broad area diode lasers, diode laser bars, and diode laser arrays. The beam coupler feature allows the output of multiple diode lasers to be confined to a small area with a relatively small beam divergence.

The apparatus of the present invention includes an elongated reflector with a highly-reflective surface. Each transverse cross section of the highly-reflective surface has a substantially parabolic curvature. The parabolic curvature defines a line of focal points which extends along the reflector to form a focal line. In a preferred embodiment, a laser beam emitter is positioned with respect to the elongated reflector such that the laser beam emitter extends along the focal line. The laser beam emitter comprises broad area laser diodes, diode laser bars, or laser diode arrays. The laser beam emitter is advantageously positioned such that the laser beams impact with and reflect off of the highly-reflective surface. Further, by adjusting the size and shape of the reflector, the size and shape of the laser beams can be manipulated. Placement of external lenses, mirrors, and non-linear crystals also serves to manipulate the laser beams.

In an alternative embodiment, the elongated reflector can be provided in the form of an optical reflector member for collimating the laser beam. The optical reflector member has a substantially hemiparabolic profile, which is defined by a curved sidewall with a highly reflective layer thereon, and two flat sidewalls.

In further embodiments, one-dimensional and two-dimensional laser array devices can be fabricated utilizing a substrate containing laser beam emitters in communication with one or more grooves in the substrate with parabolic reflecting surfaces therein. For example, a substrate is provided having an upper surface with at least one groove formed therein, with the groove having a substantially hemiparabolic profile defined by a curved sidewall. At least one laser beam emitter such as a laser diode is embedded in the substrate so as to emit a laser beam into the groove of the substrate and toward the curved sidewall. A reflective layer is formed on the curved sidewall of each groove for reflecting the laser beam out of the groove. Alternatively, a separate optical reflector member can be inserted in each groove for reflecting the laser beam out of the groove. In this case, the groove can be formed with or without the substantially hemiparabolic profile defined by a curved sidewall.

The foregoing and other objects and features of the present invention will become more fully apparent from the following description and appended claims, or may be learned by the practice of the invention as set forth hereinafter.

BRIEF DESCRIPTION OF THE DRAWINGS

In order to more fully understand the manner in which the above-recited and other advantages and objects of the invention are obtained, a more particular description of the invention will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

Figure 1A:
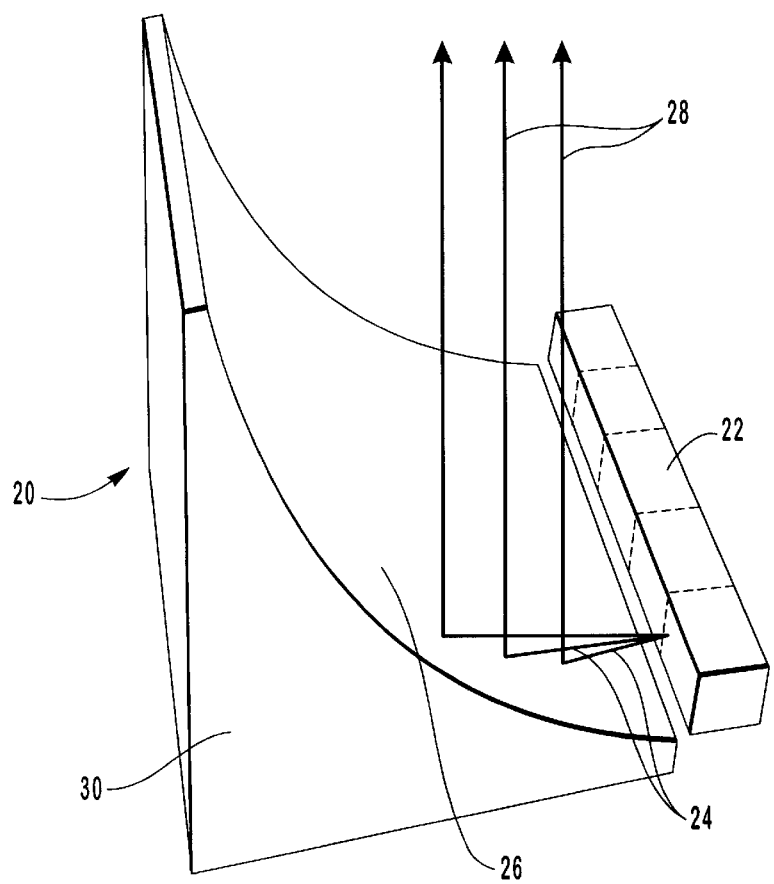
FIG. 1A is a perspective schematic view of a laser device according to one embodiment of the present invention.

High power continuous wave and quasi continuous wave diode bars have become increasingly attractive as the pump source for high power solid-state lasers due to their relative low cost and wide commercial availability. However, the conventional laser beam output from these high power diode bars is highly elliptical, which has rendered the devices difficult to use efficiently in end-pumped configurations. In turn, complex resonator designs are typically necessary with end-pumped configurations utilizing conventional high power diode bars.

Further, both broad area lasers and high-power diode laser bars have the property of fast divergence that makes it very difficult to collimate the light coming out from these lasers through the use of ordinary collimating techniques.

In addition, conventional laser diode arrays have required expensive and complex manufacturing processes to accurately secure multiple microlenses or to fabricate special diffractive lens arrays to diminish beam divergence. Still, these arrays have resulted in less than optimal power and beam quality.

In contrast, the present invention incorporates a unique design that allows the output of both single and multiple broad area diode lasers and single and multiple laser diode bars to be confined to a small area with minimal beam divergence suitable for end pumping solid state lasers. The unique design of the present invention provides high power laser beams with significantly improved beam quality while decreasing the cost and complexity of the system. In addition, the present invention is especially suitable for quasi continuous wave diode laser bars. Further, the present invention eliminates entirely the spherical aberration associated with conventional optics used to collimate diode laser beams.

The present invention can also be used in applications such as pumping nonlinear crystals to generate higher order harmonic wavelengths and achieve shorter wavelength emission. The invention can be used in coupling light into optical fibers in optical communication systems and in other optical uses.

The collimating technique of the present invention is used to collect most of the light and parallelize the fast divergent light coming out from high-power diode lasers, such as broad-area lasers and diode laser bars. By applying this collimating technique, the efficiency of high-power diode laser systems can be improved dramatically. The collimating technique of the present invention is also capable of coupling and beam shaping, which are required for improving the efficiency of diode-pumped solid-state lasers.

One preferred embodiment of the present invention comprises an elongated reflector working in concert with a laser beam emitter element. A plurality of emitted laser beams reflect off the a surface of the elongated reflector, which in turn significantly increases the efficiency and the amount of usable power of the laser beams. Specifically, it is a feature of the present invention that the conventional beam divergence is redirected such that the beams are collimated, coupled, and/or shaped as they exit the reflector.

Collimating of the output beams occurs when the beams are reflected off the surface of the elongated reflector in a parallel arrangement with respect to each other. Coupling occurs when the output of multiple individual diode lasers or even multiple individual diode laser bars is directed to a small region. Shaping the output beams is accomplished by changing the dimensions of the elongated reflector.

Referring to the drawings, wherein like structures are provided with like reference designations throughout, the drawings are schematic representations showing various aspects and embodiments of the present invention.

FIG. 1A is a perspective view of an elongated reflector 20 and laser beam emitter 22 in accordance with the present invention. The elongated reflector 20 is preferably sized according to the needs of the end user or the application for which the laser is being utilized. For example, the reflector can be hundreds of microns to a few centimeters in length, width, and height. In one embodiment of the present invention, the reflector is about 3 cm long, about 3 cm wide, and about 3 cm thick. The width of the reflector is preferably the same as the width of the laser beam emitter, with the length and height of the reflector being dependent on the parabolic curvature of the reflector, discussed in greater detail below.

It should be appreciated that very small devices such as those in the range of tens of microns are preferred for applications requiring efficient, high power laser beams on a tiny scale. One example of such a small scale application is in the ophthalmic field. Alternatively, it should be appreciated that much larger scale applications are envisioned by the apparatus and method of the present invention, and may require reflectors in the range of a few meters in size.

The elongated reflector can be made from a variety of materials such as steel, copper, nickel, and the like, which are capable of being machined by conventional processes to form a curved surface. It should be appreciated that other materials would be equally suitable for the present invention. For example, a semiconductor material, glass, fused silica, and the like, which are suitably reflective in themselves or which may be coated with a reflective coating by conventional deposition processes, can be etched to obtain a suitably curved surface.

The elongated reflector 20 has a smooth inner surface 26 which is highly reflective such as by forming a reflective coating thereon. Various reflective materials can be utilized in forming the reflective coating such as reflective metals, including aluminum, nickel, silver, copper, gold, alloys and combinations thereof, and the like. In one preferred embodiment of the present invention, the inner surface is coated with a reflective coating of aluminum. It has been demonstrated that aluminum yields a reflectivity of about 92%. A preferred thickness for the aluminum reflective coating is from about 100 nm to about 3 μm. It should be appreciated that thicker coatings exhibit better surface characteristics, but are also more costly and time consuming to produce than less thick coatings.

In an alternate embodiment of the present invention, the reflective coating comprises a layer of nickel which yields a reflectivity of about 97%. It should be appreciated in accordance with the invention described herein, that other reflective coatings could be alternatively or additionally utilized to facilitate the reflectivity of inner surface 26 of reflector 20. Alternatively, the inner surface of reflector 20 itself may be uncoated but highly polished to effectuate an appropriate reflectivity.

Figure 2:
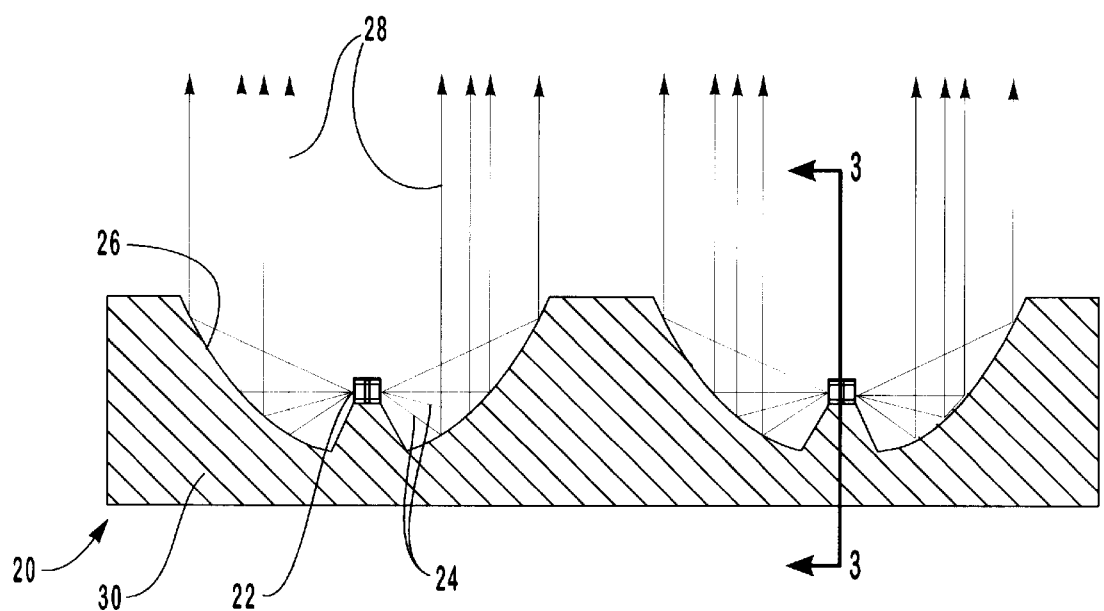
FIG. 2 is a cross-sectional schematic end view of a laser device according to a further embodiment of the present invention.

In a preferred embodiment of the present invention, inner surface 26 is curved such that in cross section the curvature resembles one side of a parabola. FIG. 2, for example, illustrates four elongated reflectors in cross section, each of which resembles half, or one side, of a parabola, and is thus referred to herein as "hemiparabolic." It will be appreciated by inspection of FIG. 2 that two elongated reflectors can be situated such that in cross section the reflectors face each other on either side of the laser beam emitter, thereby defining two hemiparabolic cavities. Alternatively, the reflectors can be used individually or separated by some distance.

Further, each cross section of the parabolically curved surface has a corresponding focal point defined generally by the equation, $f=x^2/4y$. In a preferred embodiment of the present invention, the elongated reflector includes a focal line comprising each cross-sectional focal point extending the width of the elongated reflector in a single plane.

The steepness or slope of the curvature of the parabolic surface is varied according to the preference of the end user and the application for which it will be used. For example, the steeper the slope of the curvature cavity, the more narrow the width of the exiting laser beams. A more flattened slope results in a much larger height of the exiting laser beams.

In addition, the precise placement of the laser beam emitter within the elongated reflector effectuates different beam characteristics. It is an important feature of the present invention that the laser beam emitter is positioned in a single plane with respect to the elongated reflector. This single plane is designed by reference to the focal line of the parabolic surface.

Figure 4:
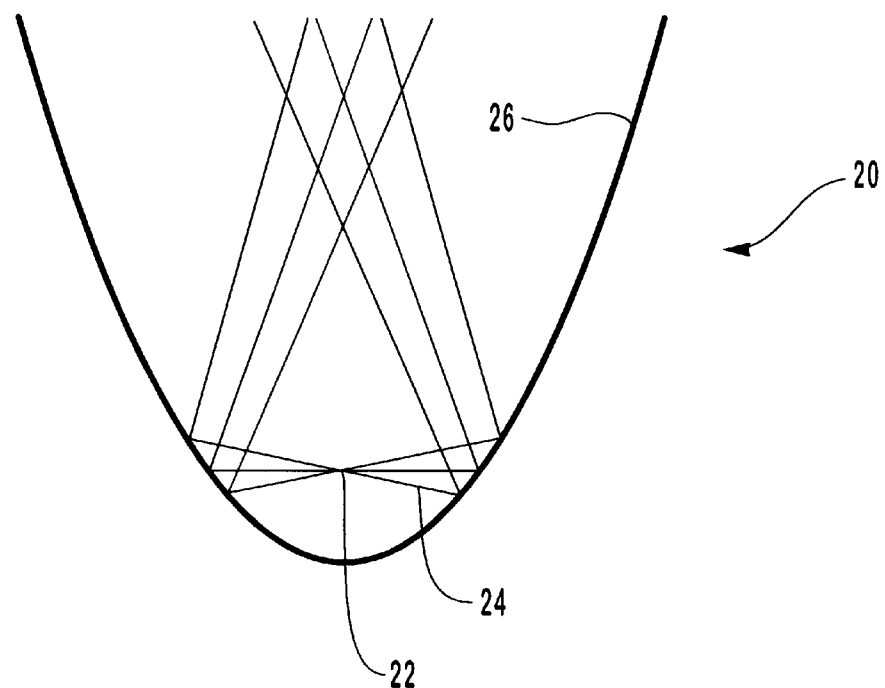
FIG. 4 is a cross-sectional schematic view of a further embodiment of the present invention.
Figure 5:
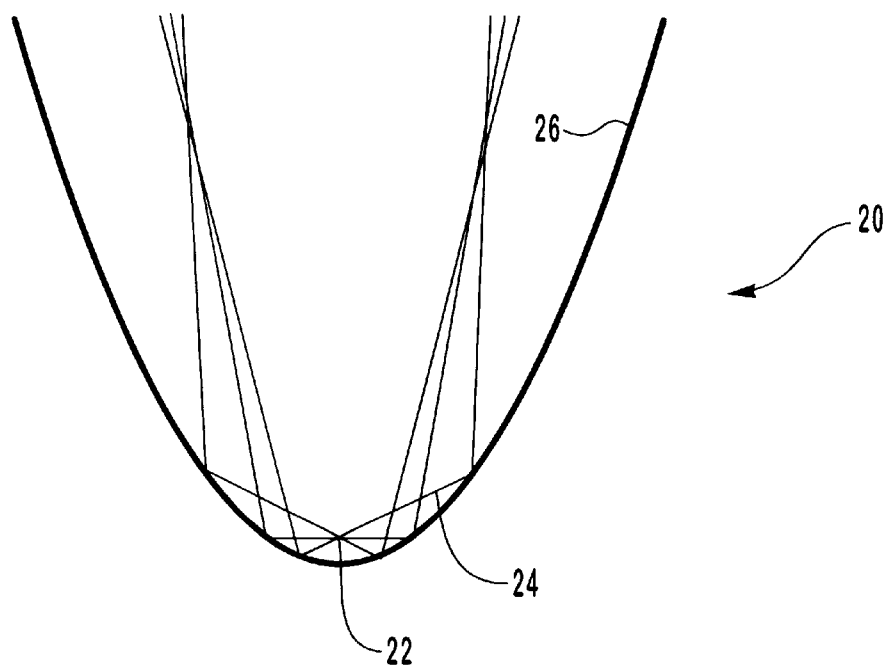
FIG. 5 is a cross-sectional schematic view of yet another embodiment of the present invention.

For example, in a preferred embodiment of the present invention depicted in FIG. 1A, the laser beam emitter 22 is positioned such that the laser beams are emitted at the focal line of the parabolic inner surface. The divergent rays 24 of the laser beam from emitter 22 are collimated by reflector 20 into collimated rays 28. Alternatively, different beam configurations are achieved when the laser beam emitter is positioned above the focal line as illustrated in FIG. 4, or beneath the focal line of the reflector as illustrated in FIG. 5.

In a further embodiment of the present invention, a lens is positioned just beyond the elongated reflector to focus the beams exiting the reflector.

The laser beam emitter 22 illustrated in FIG. 1A, preferably comprises at least one broad area diode laser, diode laser bar, or diode laser array. In one embodiment of the invention, the diode laser bar or array can be made of individual diode lasers that have been detachably assembled together such as shown in the phantom lines of laser beam emitter 22 in FIG. 1A. One- and two-dimensional laser arrays can be assembled from individual diode lasers by affixing the individual diode lasers together or placing them in grooves formed in a substrate. This allows an individual diode laser to be removed from the laser bar or array and replaced when the diode laser stops functioning. Thus, an entire diode laser bar or array does not need to be replaced when only one diode laser has ceased being functional. The individual diode lasers can be assembled together to form a laser bar by using an adhesive material such as an epoxy. Alternatively, the individual diode lasers may be clamped together or placed into appropriately sized grooves.

A preferred diode laser bar has a width of about 1 cm. A plurality of diode bars is commonly referred to as a diode array. The present invention is directed to unique arrangements for diode laser arrays, and is not limited to the end-pumping and planar configuration of commercially available laser diode arrays. To the contrary, the present invention envisions the use of side pumping and flexible designs. Further, higher power is achieved by stacking the diode laser bars on top of each other to form two dimensional diode laser arrays.

In a preferred embodiment of the present invention, the diode bar includes a semiconductor laser such as those comprising gallium indium phosphide. In an alternate embodiment of the present invention, the diode bar comprises gallium arsenide antimonide semiconductor lasers. It will be appreciated by those of skill in the art that the diode laser may comprise virtually any combination of semiconductor compounds conventionally utilized in diode laser applications.

Figure 3:
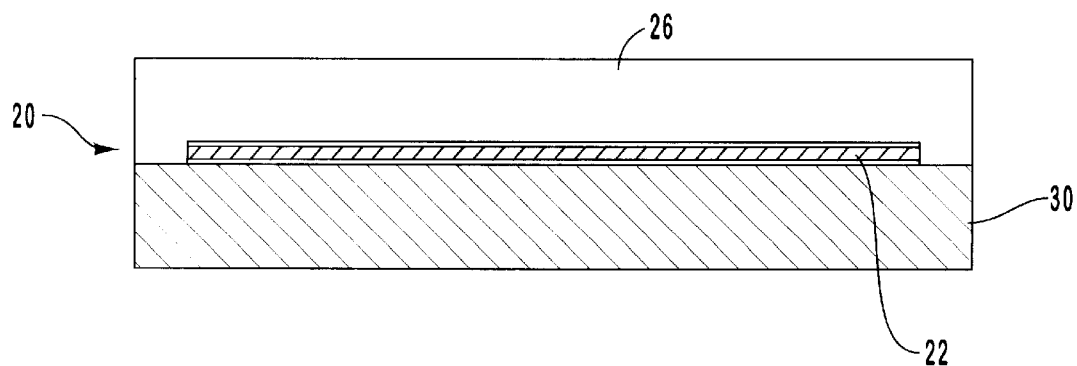
FIG. 3 is a cross-sectional longitudinal view of the laser device of FIG. 2 taken along the line 3—3 in FIG. 2.

An alternate embodiment of the present invention comprises a laser beam emitter in the form of a broad area diode laser. A preferred broad area diode laser is about 800 μm in length, and the light emitting aperture or facet of the diode bar is about 1 μm in height by about 100 μm in width. FIG. 3 illustrates the narrow aperture of the broad area laser diode in cross section through line 3—3 of FIG. 2. Individual broad area diode lasers can be placed along a focal line of an elongated parabolic reflector to form a diode laser bar of individual diodes. This configuration advantageously features individual diode pumping and replacement.

Preferably, the wavelength of light emitted by each broad area laser diode or laser diode bar is about 810 nanometers. Alternatively, the wavelength of light emitted by each broad area laser diode or laser diode bar is about 980 nanometers. However, the present invention is in no way limited to either wavelength. By way of example only and not limitation, the present invention envisions wavelengths from infrared to the ultraviolet.

In a preferred embodiment of the present invention, the output of each broad area diode laser is from about 100 milliwatts to several watts. A diode laser bar can generate beam powers of from about 20 watts to about 100 watts. Alternatively, when the diode laser bars are combined into diode laser bar arrays, beam powers from hundreds to thousands of watts and higher can be achieved. Further, when the arrays are utilized in accordance with the present invention as will be described in more detail hereinbelow, the resulting power achieved can be on the order of thousands of watts for diode-pumped solid state lasers, or for diode-pumped fusion lasers. In quasi continuous wave operation, significantly higher peak power can be achieved, such as tens of thousands of watts up to about 100 kilowatts or even up to about 1 megawatt ($10^6$ watts).

The generation of such high power also generates significant amounts of heat. Therefore, as illustrated in FIGS. 1A and 2, the present invention can include a heat sink 30 which surrounds laser beam emitter 22. The heat sink 30 is made of materials that absorb and dissipate the excess heat generated by operation of laser beam emitter 22. The heat sink can be made from various materials such as copper, aluminum nitride, beryllium oxide, combinations thereof, and the like. For example, beryllium oxide can be utilized between layers of copper as an additional heat dissipator. In addition, the heat sink can function as an outer base for the apparatus of the present invention as a whole and can support reflector 20 as illustrated in FIGS. 1A and 2. As should be appreciated by inspection of FIGS. 1A and 2, heat sink 30 forms the external material surrounding inner surface 26 of reflector 20. Alternatively, a separate heat sink is not necessary, if an individual diode laser package is used that already provides adequate heat sinking for each device.

It should also be appreciated that more than one elongated reflector and laser beam emitter combination can be utilized at one time. For example, in FIG. 2, four reflectors are depicted immediately adjacent one another. It should be understood that the present invention envisions other configurations when multiple reflectors are used in conjunction with one another.

Figure 1B:
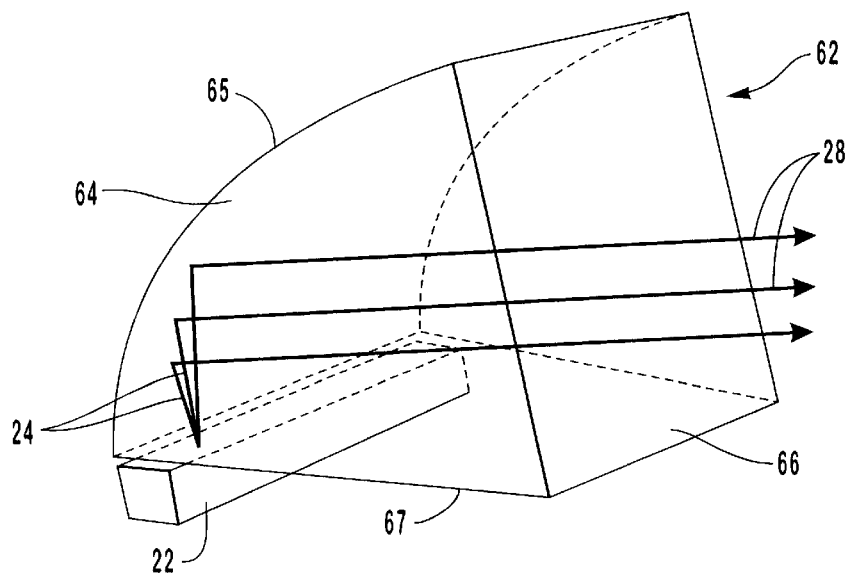
FIG. 1B is a perspective schematic view of a laser device according to another embodiment of the the present invention.

In an alternative embodiment of the invention shown in FIG. 1B, the elongated reflector can be provided in the form of an optical reflector member 62 for collimating the laser beam. The optical reflector member 62 has a substantially hemiparabolic profile, which is defined by a curved sidewall 64 with a highly reflective layer 65 thereon, and two flat sidewalls 66 and 67. The optical reflector member 62. can be made as a solid piece of optics by forming a light transmissive material, such glass or plastic materials, into the appropriate shape by conventional molding techniques. For example, fused silica, glass Schott F2, and the like can be utilized in forming reflector member 62.

The highly reflective layer 65 is formed on the convex surface of curved sidewall 64 in order to reflect laser light generated by laser beam emitter 22. Various reflective materials can be utilized in forming reflective layer 65 such as the reflective metals discussed above with respect to reflector 20. A conventional antireflective coating can be formed on the surface of flat sidewall 66 through which a laser beam is transmitted. Alternatively, the antireflective coating can be formed on the surface of sidewall 67 placed over emitter 22, or on the surfaces of both sidewalls 66 and 67.

The laser beam emitter 22 is preferably positioned with respect to reflector member 62 such that the laser beams are emitted at the focal line of the parabolic surface of curved sidewall 64. During operation, the divergent rays 24 of the laser beam from emitter 22 pass through flat sidewall 67 and are reflected off of curved sidewall 64 into collimated rays 28, which pass through flat sidewall 66.

Figure 6:
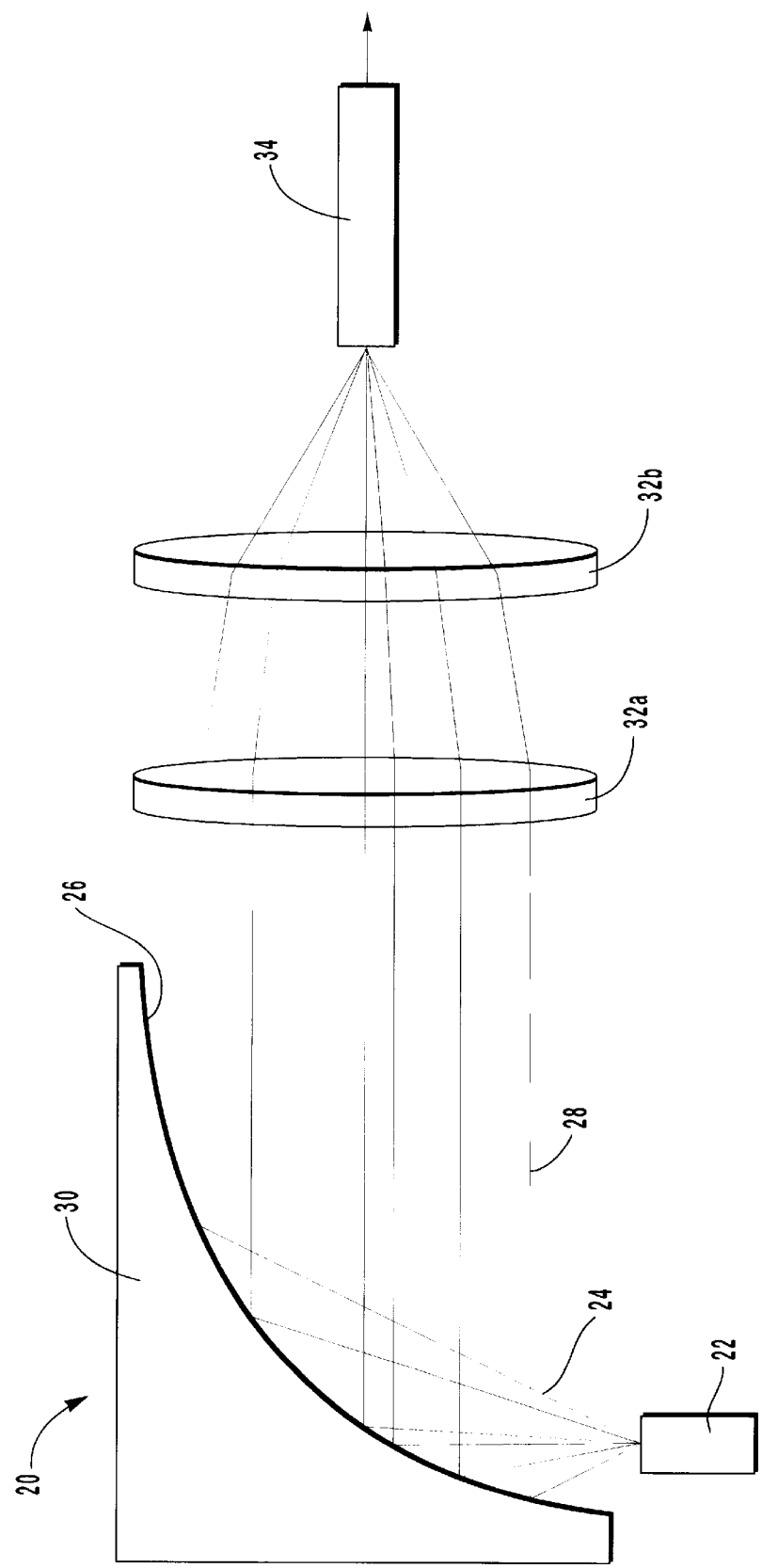
FIG. 6 is a schematic view of another embodiment of the present invention.

In another embodiment of the present invention illustrated in FIG. 6, a laser beam emitter 22 is placed along the focal line of elongated reflector 20, as previously described hereinabove. The laser beam emitter can be a broad area diode laser comprising red diode lasers or infrared diode lasers such as near infrared diode lasers. The divergent rays 24 of the laser beam from the diode laser are collimated by reflector 20 into collimated rays 28 and then passed through a system of focusing lenses 32a and 32b. The laser light then passes through a nonlinear crystal 34. By way of example only and not limitation, the nonlinear crystal preferably comprises lithium tantalate, potassium titanyl phosphate, or lithium niobate.

It should be appreciated that the lens configuration can be varied according to the degree of focusing required and the space available. Alternatively, a system of a plurality of conventional collimating and focusing lenses, and/or a graded-refractive index lens could be used with the apparatus of the present invention.

Figure 7:
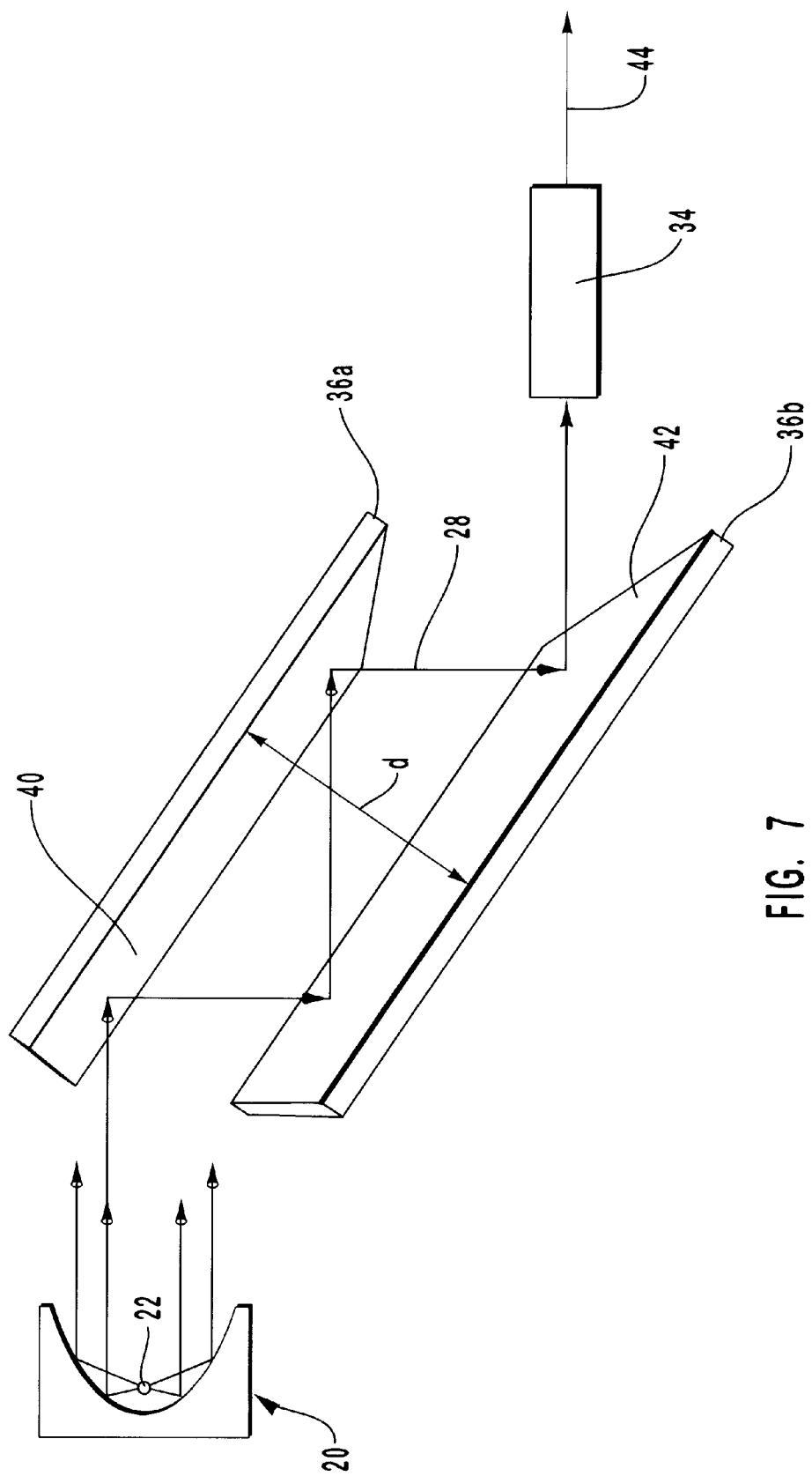
FIG. 7 is a schematic view of yet another embodiment of the present invention.

In yet another embodiment of the present invention illustrated in FIG. 7, diode laser bars are utilized in conjunction with a stripe mirror configuration to form a beam shaper apparatus. A laser beam emitter 22 is placed along the focal line of reflector 20, as previously described hereinabove. The stripe mirror configuration is positioned beyond reflector 20 and is utilized to provide enhanced beam quality.

The stripe mirror configuration preferably comprises two nearly parallel mirrors 36a and 36b, which are placed at opposite sides of a central axis and are separated by a small distance d, as illustrated in FIG. 7. The mirrors are preferably slightly transversely offset from each other such that small sections of each mirror are not obscured by each other. The unobscured sections form the input aperture 40 and output aperture 42 for the rays 28. The mirrors further comprise reflective stripes (not shown) which are preferably placed such that they coincide with the focal plane of the reflector 20.

This type of parallel mirror beam shaper requires a thin sheet of a collimated beam which is provided by laser beam emitter 22 and reflector 20 of the present invention. The function of the parallel mirror beam shaper of FIG. 7 is to squeeze the long dimension of the thin sheet beam and bring this dimension to a very small size.

It will be understood by the schematic view represented in FIG. 7 that the light which is incident on the first mirror 36a is reflected back towards the diode laser array for optical feedback. The light which is incident on the first mirror 36a is also reflected towards the second mirror 36b and undergoes multiple reflections between the two mirrors. The laser light then passes through a nonlinear crystal 34. The result is a single output beam 44 at one angle, providing a nicely confined beam in a fairly small area. It should be appreciated that beam shaping can be accomplished by alterations in the mirror spacing and the angles of incidence of the light or of the mirrors with respect to each other.

It should be also appreciated that the present invention is not limited to the configuration illustrated in FIG. 7, but can be varied according to the degree of collimation required, the needs of the user, and the space available, for example.

FIGS. 8–16 illustrate additional embodiments of the present invention in the form of one-dimensional or two-dimensional laser arrays formed within a substrate.

Figure 8:
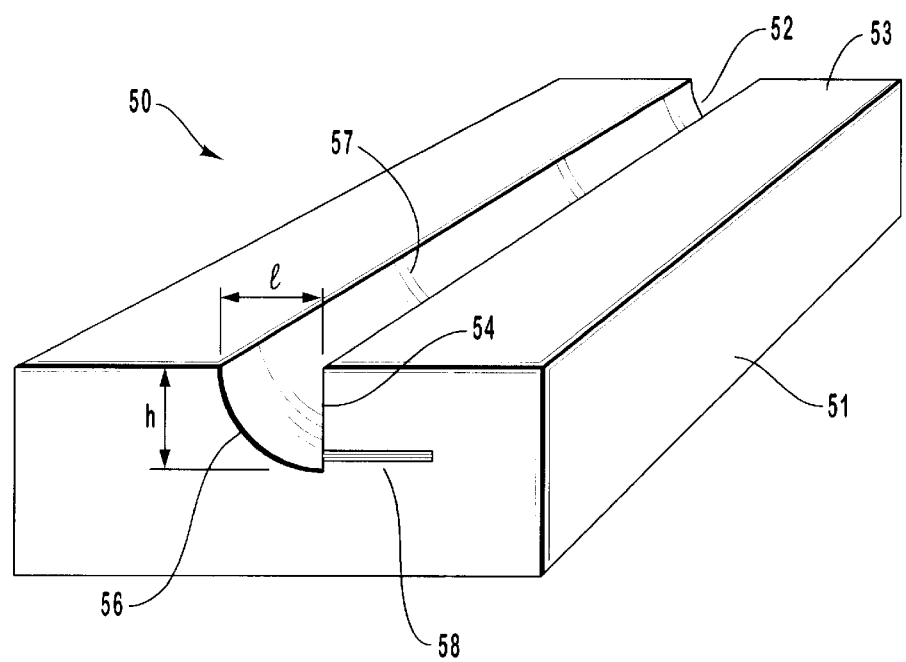
FIG. 8 is a perspective schematic view of a one-dimensional laser array device according to another embodiment of the present invention.

FIG. 8 depicts a one-dimensional laser array 50 in accordance with a further embodiment of the present invention. The laser array 50 includes a substrate 51 with a single trough or groove 52 formed in an upper surface 53 of substrate 54. The groove 52 can be formed by a conventional etching process such as used in semiconductor device fabrication. The groove 52 is defined by a two-sided configuration, including a flat sidewall 54 and a curved sidewall 56 that extends upwardly from the bottom of sidewall 54. It should be understood that flat sidewall 54 can have a substantially perpendicular configuration with respect to upper surface 53 as shown in FIG. 8 or can be angled with respect to upper surface 53. The curved sidewall 56 forms a concave surface 57 with a preferably hemiparabolic shape such that groove 52 has a substantially hemiparabolic profile.

A laser beam emitter 58 is embedded in substrate 51 so that each facet of emitter 58 directs laser light into groove 52 toward concave surface 57. Thus, the facets of emitter 58 are located along sidewall 54 opposite from concave surface 57. The emitter 58 is embedded in substrate 51 by conventional integrated circuit fabrication techniques or by simply affixing the emitter in a slot formed in sidewall 54. Preferably, emitter 58 comprises at least one broad area diode laser or a diode laser bar that is fabricated by conventional techniques. For example, the emitter 58 can be a red diode laser bar, an infrared diode laser bar such as a near infrared diode laser bar, and the like. The diode lasers utilized may include any combination of semiconductor compounds conventionally used in diode laser applications.

The substrate 51 can be made of various materials that are highly thermally conductive such as metallic or ceramic materials in order to permit dissipation of heat generated by laser beam emitter 58. For example, substrate 51 can be made of copper, beryllium oxide, aluminum nitride, or combinations thereof, such as beryllium oxide layers formed between layers of copper. The substrate 51 acts as a heat sink for the heat generated by the diode lasers during operation.

A reflection means is disposed in groove 52 for reflecting the rays of the laser beam generated by emitter 58 out of groove 52. The reflection means defines a parabolic reflective surface along groove 52. For example, the reflection means can be a highly reflective coating or layer formed on concave surface 57 of curved sidewall 56 in order to reflect laser light generated by emitter 58 into collimated rays or rays of other configurations as desired. Various reflective materials can be utilized in forming the reflective coating such as reflective metals, including aluminum, nickel, silver, copper, gold, alloys and combinations thereof, and the like. A conventional antireflective coating or layer comprising thin multilayers of dielectric materials can be formed on the surface of sidewall 54 if groove 52 contains a medium other than air. The coatings utilized in the invention can be formed by chemical vapor deposition or other conventional deposition techniques known to those skilled in the art, and can have a thickness in a range from about 100 nm to about 3 $\mu$m. Alternatively, the reflection means can be an uncoated but highly polished concave surface 57 when substrate 51 is formed from a reflective metallic material in order to effectuate an appropriate reflectivity.

The groove 52 is sized according to the needs of the end user or the application for which laser array 50 is being utilized. For example, groove 52 can be sized such that the height h of groove 52 is from about 5 $\mu$m to about 3 cm, and preferably from about 50 $\mu$m to about 100 $\mu$m. Once the height is specified, the length l is determined from the parabolic curvature of sidewall 56. For example, the length l can be from about 5 $\mu$m to about 3 cm, and preferably from about 50 $\mu$m to about 100 $\mu$m.

It should be understood that each transverse cross section of groove 52 has a corresponding focal point for the curved sidewall 56 such that a focal line comprising each focal point extends the width of groove 52 in a single plane. The steepness or slope of the curvature of curved sidewall 56 can be varied during formation of groove 52 according to the preference of the end user and the application for which the device will be used in order to vary the position of the focal line as desired.

In addition, the precise placement of laser beam emitter 58 within substrate 51 effectuates different beam characteristics. The emitter 58 is preferably positioned in substrate 51 in a single plane with respect to curved sidewall 56 during fabrication of laser array 50 such that the laser beam will be directed at the reflective surface. This single plane is designed by reference to the focal line of the curved sidewall 56. For example, emitter 58 can be positioned in substrate 51 such that laser beams are emitted at the focal line of curved sidewall 56, with the resulting rays of the laser beams exiting groove 52 being collimated upon reflection off of the reflective surface. Alternatively, different beam configurations are achieved when emitter 58 is positioned above the focal line or beneath the focal line, such as diverging or converging rays of the laser beams.

Figure 9:
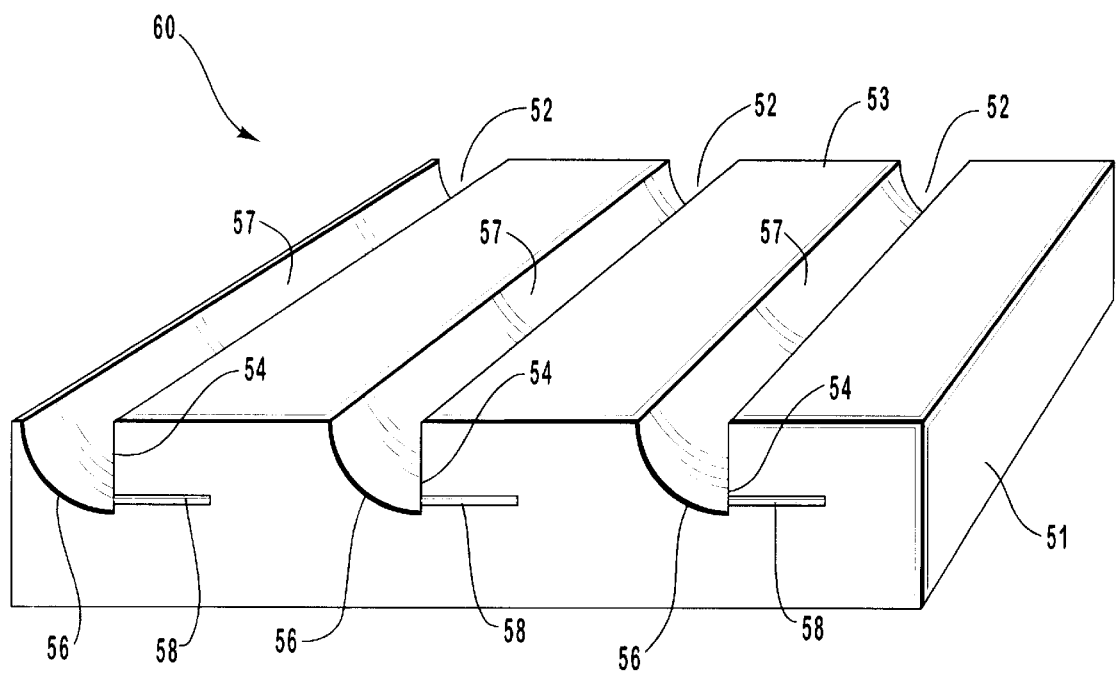
FIG. 9 is a perspective schematic view of a two-dimensional laser array device according to a further embodiment of the present invention.

FIG. 9 depicts a two-dimensional laser array 60 in accordance with another embodiment of the present invention that incorporates the features of laser array 50. Accordingly, laser array 60 is fabricated in the same manner as laser array 50 discussed above, except that a plurality of grooves 52 are formed in substrate 51, with each groove 52 being in communication with a laser beam emitter 58 embedded in substrate 51. While FIG. 9 shows three grooves in substrate 51, it should be understood that any number of grooves may be formed in substrate 51 depending on the size of the substrate and the desired application. For example, two or more grooves could be formed in a substrate used in fabricating a two-dimensional laser array according to the present invention.

Each concave surface 57 of laser array 60 is highly reflective in order to reflect the laser light generated by each emitter 58 into collimated rays or rays of other configurations. Thus, concave surface 57 can have a highly reflective coating formed thereon or can be highly polished as discussed above. The laser array 60 is fabricated such that one emitter 58 is disposed between a pair of adjacent grooves 52. Thus, grooves 52 are preferably formed such that the curved sidewalls 56 face the same direction.

Figure 10A:
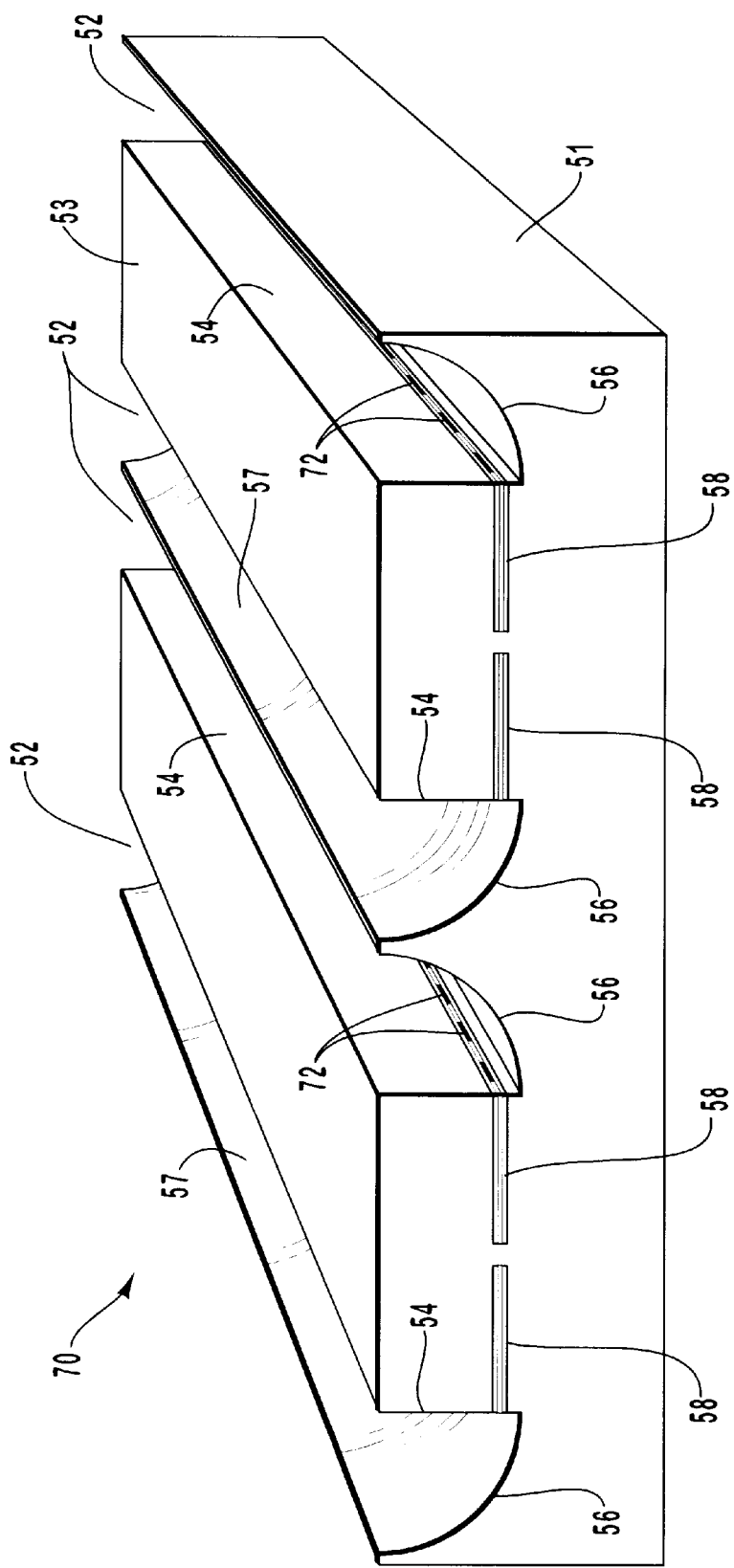
FIG. 10A is a perspective schematic view of a two-dimensional laser array device according to an alternative embodiment of the present invention.
Figure 10B:
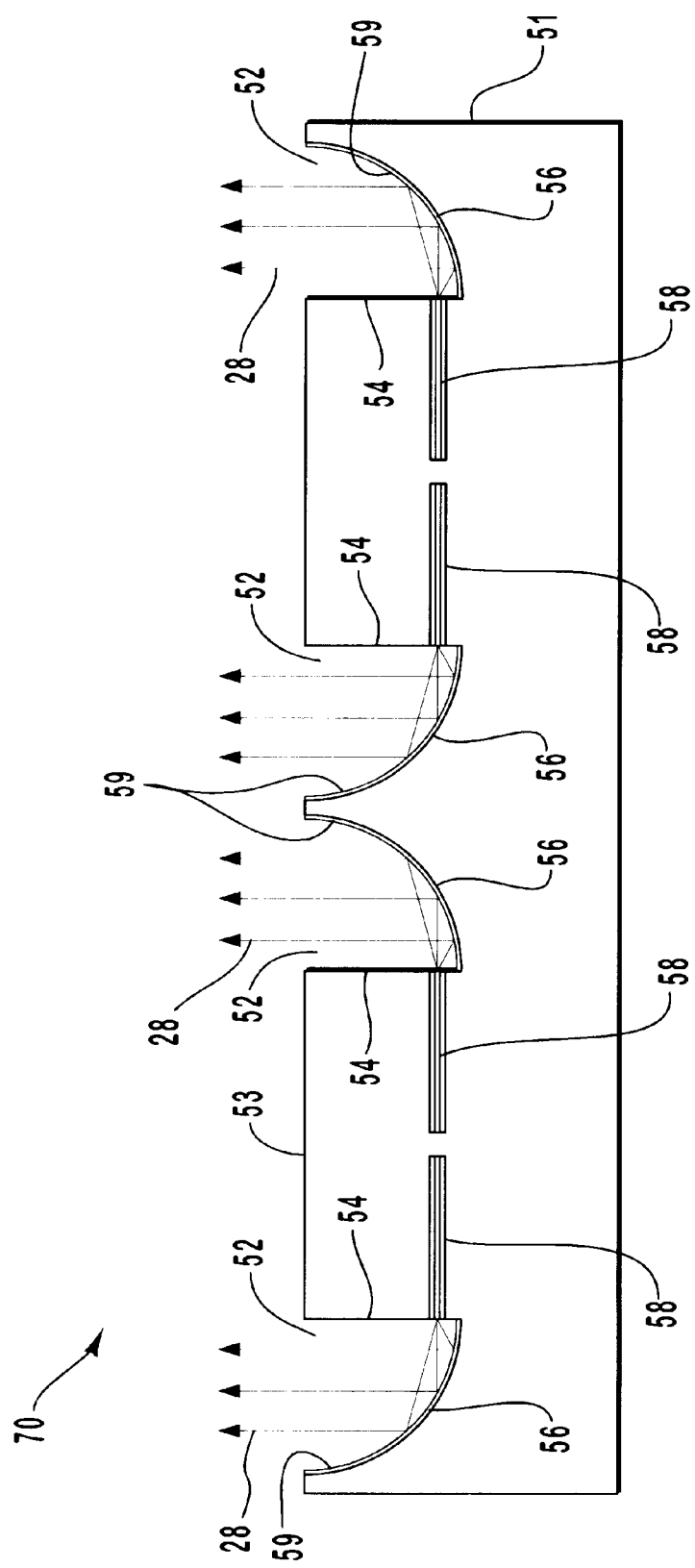
FIG. 10B is an end view of the laser array device of FIG. 10A.

FIGS. 10A and 10B depict a two-dimensional laser array 70 in accordance with an alternative embodiment of the invention that incorporates similar features as laser array 60. Thus, laser array 70 includes a plurality of grooves 52 formed in substrate 51, with each groove 52 being in communication with a laser beam emitter 58 having a plurality of facets 72. Each concave surface 57 of laser array 70 is highly reflective in order to reflect the laser light generated by each emitter 58 into collimated rays 28 such as shown in FIG. 10B.

The laser array 70 is fabricated, however, such that each pair of emitters 58 are disposed in a back-to-back relationship between opposing grooves 52, as depicted in FIGS. 10A and 10B. For example, laser diodes can be embedded in substrate 51 so as to have a paired back-to-back configuration in substrate 51. The grooves 52 are formed such that the curved sidewalls 56 alternately face opposite directions.

As shown in FIG. 10B, during operation of laser array 70, laser light is emitted from each emitter 58 into a corresponding groove 52 toward curved sidewall 56 having a highly reflective surface such as a reflective layer 59. The laser light is reflected off of reflective coating 59 and out of each groove 52 past upper surface 53 in the form of collimated rays 28. The collimated rays 28 can be directed through other optical devices as desired, such as a lens, mirror, or a series of lenses and mirrors (not shown) to focus the rays exiting each groove 52.

Figure 11:
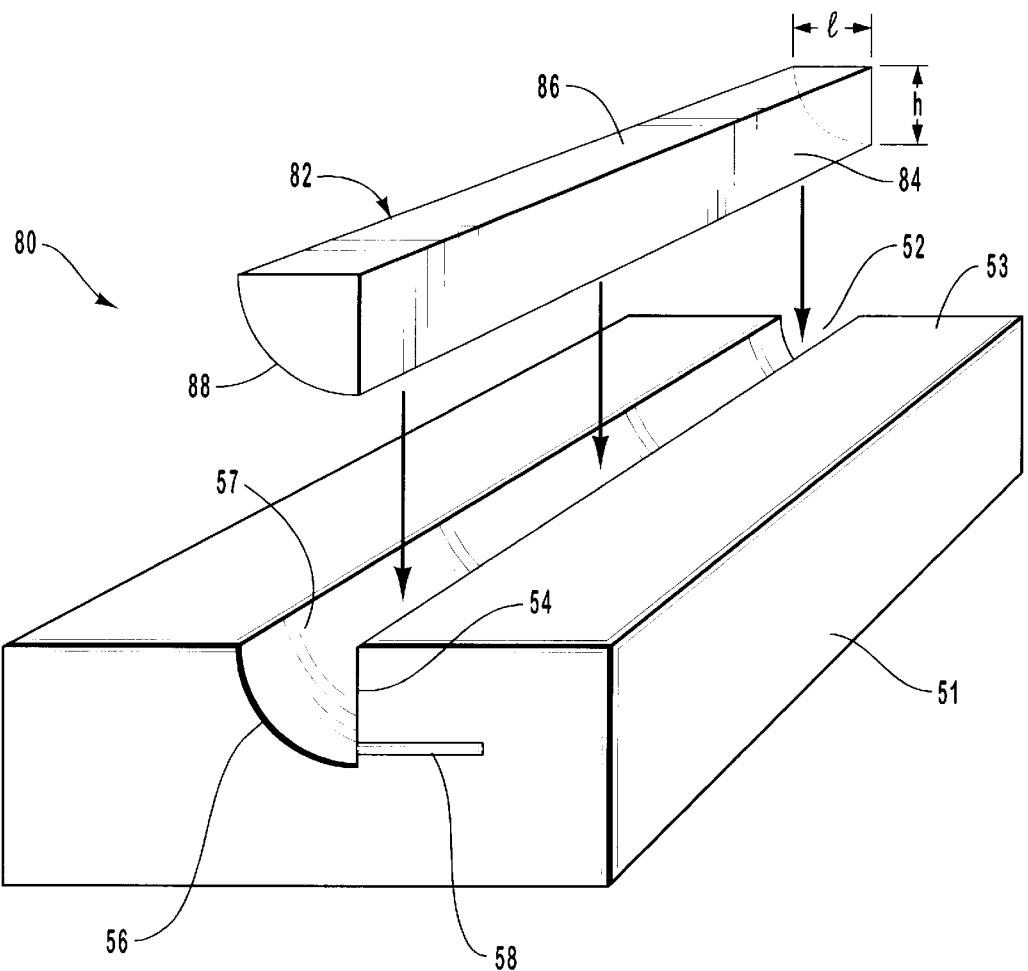
FIG. 11 is a perspective schematic view of a one-dimensional laser array device according to another embodiment of the present invention.

FIG. 11 depicts a one-dimensional laser array 80 in accordance with another embodiment of the present invention which includes some of the same features as laser array 50. Accordingly, laser array 80 includes a substrate 51 with a single groove 52 formed therein by conventional techniques as discussed previously. The groove 52 is defined by a two-sided configuration, including a flat sidewall 54 and a curved sidewall 56 having a concave surface 57, which give groove 52 a substantially hemiparabolic profile as shown in FIG. 11. Alternatively, the groove can be formed without the substantially hemiparabolic profile defined by a curved sidewall, such as by having a rectangular profile. A laser beam emitter 58 is embedded in substrate 51 so that each facet of emitter 58 directs laser light into groove 52 toward concave surface 57.

A reflection means is provided in the form of an optical reflector member 82 having a substantially hemiparabolic profile which is constructed to fit within groove 52 of substrate 51. The reflector member 82 is formed as a solid piece of optics such as a microlens with three elongated sides. Accordingly, reflector member 82 has a flat sidewall 84 and a flat upper wall 86 that is perpendicular to sidewall 84. The sidewall 84 of reflector member 82 abuts against sidewall 54 of groove 52 when reflector member 82 is placed therein. The reflector member 82 also has a curved sidewall 88 having a convex surface with a preferably hemiparabolic shape.

The reflector member 82 can be made by forming a light transmissive material, such glass or plastic materials, into the appropriate shape by conventional molding techniques. For example, fused silica, glass Schott F2, and the like, can all be utilized in forming the optical reflector member into the desired elongated hemiparabolic shape.

A highly reflective layer or coating is formed on the convex surface of curved sidewall 88 in order to reflect laser light generated by emitter 58. Various reflective materials can be utilized in forming the reflective coating such as reflective metals, including aluminum, silver, nickel, copper, gold, alloys and combinations thereof, and the like. A conventional antireflective coating can be formed on the surface of flat sidewall 84 through which a laser beam is transmitted from emitter 58. Alternatively, the antireflective coating can be formed on the surface of sidewall 54 over emitter 58, or on the surfaces of both sidewall 84 and sidewall 54. The coatings on reflector member 82 are formed by conventional coating processes known to those skilled in the art, and can have a thickness in a range from about 100 nm to about 3 $\mu$m.

The optical reflector member 82 is sized according to the needs of the end user or the application for which laser array 80 is being utilized. The reflector member 82 can be sized such that upper wall 86 has a length l of from about 5 $\mu$m to about 3 cm, and preferably from about 50 $\mu$m to about 100 $\mu$m. The flat sidewall 84 can also have a height h of from about 5 $\mu$m to about 3 cm, and preferably from about 50 $\mu$m to about 100 $\mu$m. The groove 52 is sized in a similar fashion so as to accommodate placement of reflector member 82 therein.

It should be understood that each transverse cross section of reflector member 82 has a corresponding focal point for the curved surface of sidewall 88 such that reflector member 82 includes a focal line comprising each cross-sectional focal point extending the width of reflector member 82 in a single plane. The steepness or slope of the curvature of curved sidewall 88 can be varied during formation of reflector member 82 according to the preference of the end user and the application for which the device will be used in order to vary the position of the focal line as desired.

In addition, the precise placement of laser beam emitter 58 within substrate 51 effectuates different beam characteristics. The emitter 58 is preferably positioned in substrate 51 in a single plane with respect to reflector member 82 during fabrication of laser array 80. This single plane is designed by reference to the focal line of the curved surface of sidewall 88 of reflector member 82, For example, emitter 58 can be positioned such that laser beams are emitted at the focal line of curved sidewall 88, with the resulting beams exiting reflector member 82 being collimated. Alternatively, different beam configurations are achieved when emitter 58 is positioned above the focal line or beneath the focal line of reflector 82, such as diverging or converging rays of the laser beams.

Figure 12:
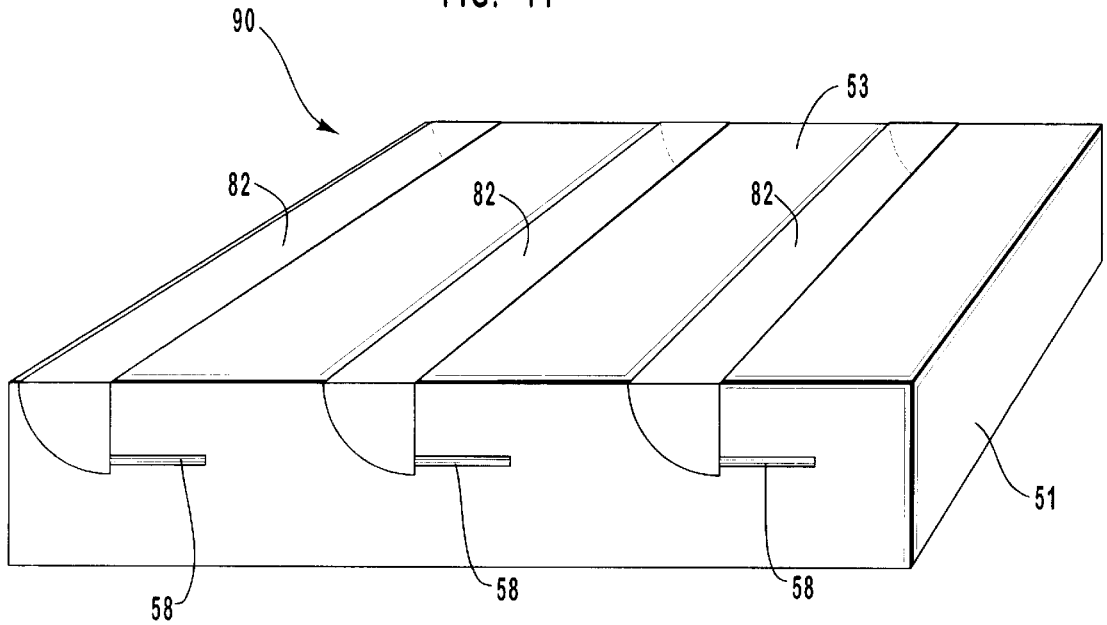
FIG. 12 is a perspective schematic view of a two-dimensional laser array device according to a further embodiment of the present invention.

FIG. 12 depicts a two-dimensional laser array 90 in accordance with another embodiment of the present invention that incorporates the features of laser array 80. Accordingly, laser array 90 is fabricated in the same manner as laser array 80, except that a plurality of grooves are formed in substrate 51, with each groove being in communication with a laser beam emitter 58. An optical reflector member 82 is inserted into each groove of substrate 51 as shown in FIG. 12. The highly reflective coating formed on the convex surface of the curved sidewalls of each reflector 82 reflects laser light generated by emitters 58 into collimated rays or rays of other configurations as desired. The laser array 90 is fabricated such that one emitter 58 is disposed between a pair of adjacent inserted reflector members 82, Thus, the curved sidewalls of reflector members 82 face the same direction.

Figure 13A:
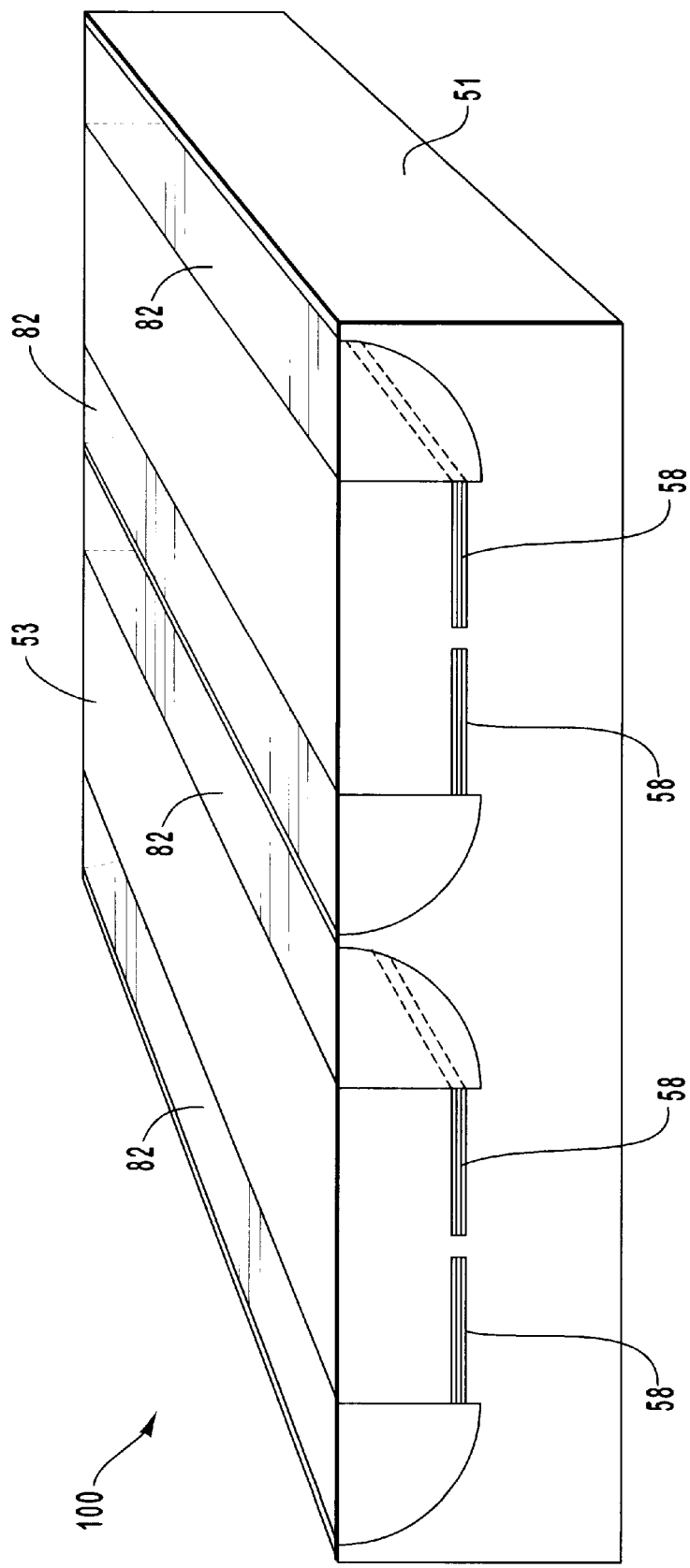
FIG. 13A is a perspective schematic view of a two-dimensional laser array device according to an alternative embodiment of the present invention.
Figure 13B:
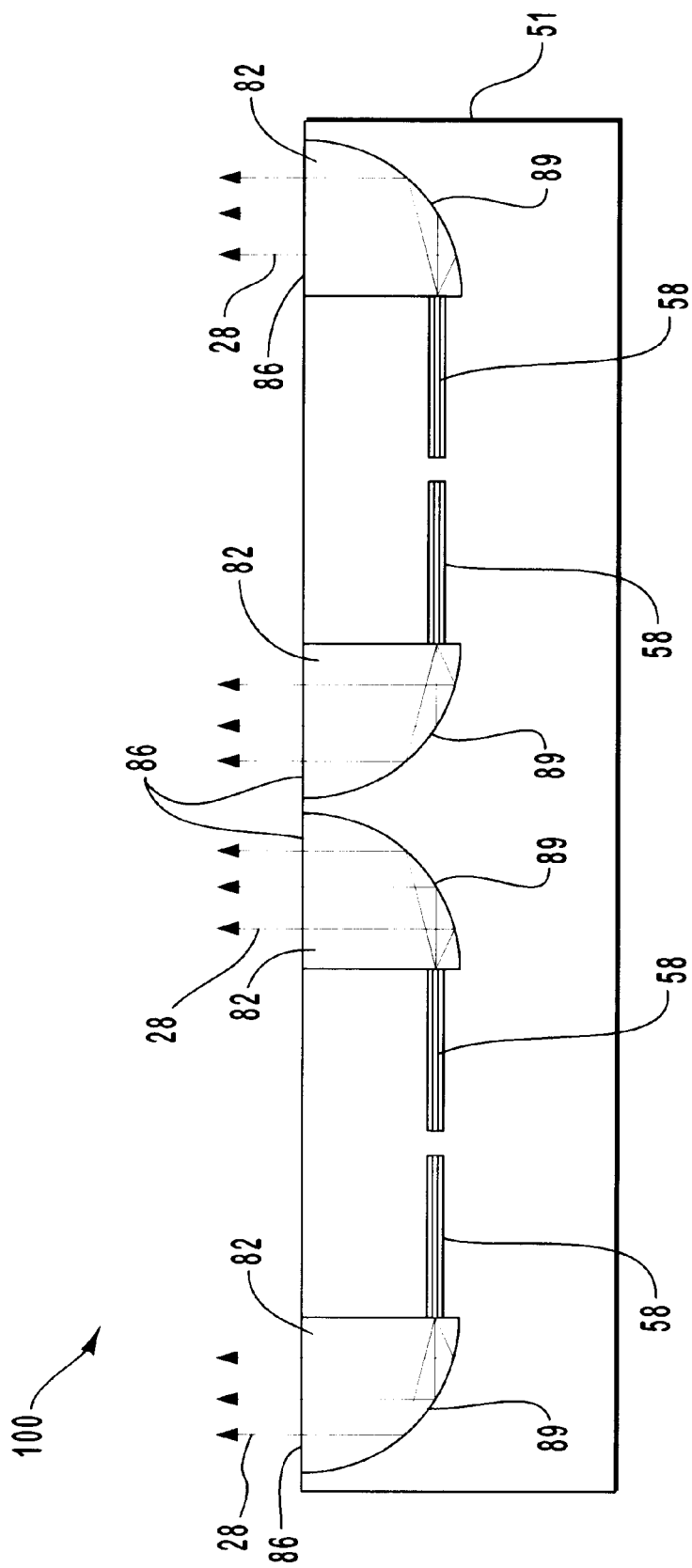
FIG. 13B is an end view of the laser array device of FIG. 13A.

FIGS. 13A and 13B depict a two-dimensional laser array 100 in accordance with an alternative embodiment of the invention that incorporates similar features as laser array 90. Accordingly, laser array 100 includes a plurality of reflector members 82 inserted in grooves formed in substrate 51, with each groove being in communication with a laser beam emitter 58. The highly reflective coating formed on the convex surface of the curved sidewalls of each reflector 82 reflects laser light into collimated rays 28 as shown in FIG. 13B or rays of other configurations as desired.

The laser array 100 is fabricated such that each pair of emitters 58 are disposed in a back-to-back configuration between a pair of opposing reflector members 82, as depicted in FIGS. 13A and 13B. Thus, reflector members 82 are positioned in the grooves of substrate 51 such that the curved sidewalls of reflector members 82 alternately face opposite directions.

As shown in FIG. 13B, during operation of laser array 100, laser light is emitted from each emitter 58 and into a corresponding reflector member 82, The laser light is reflected internally off of a reflective layer 89 formed on each curved sidewall 88 and travels out through upper wall 86 of each reflector member 82 in the form of collimated rays 28. The collimated rays 28 can be directed through other optical devices as desired, such as a lens, mirror, or a series of lenses and mirrors (not shown) positioned just beyond reflector members 82 to focus the rays exiting reflector members 82.

Figure 14:
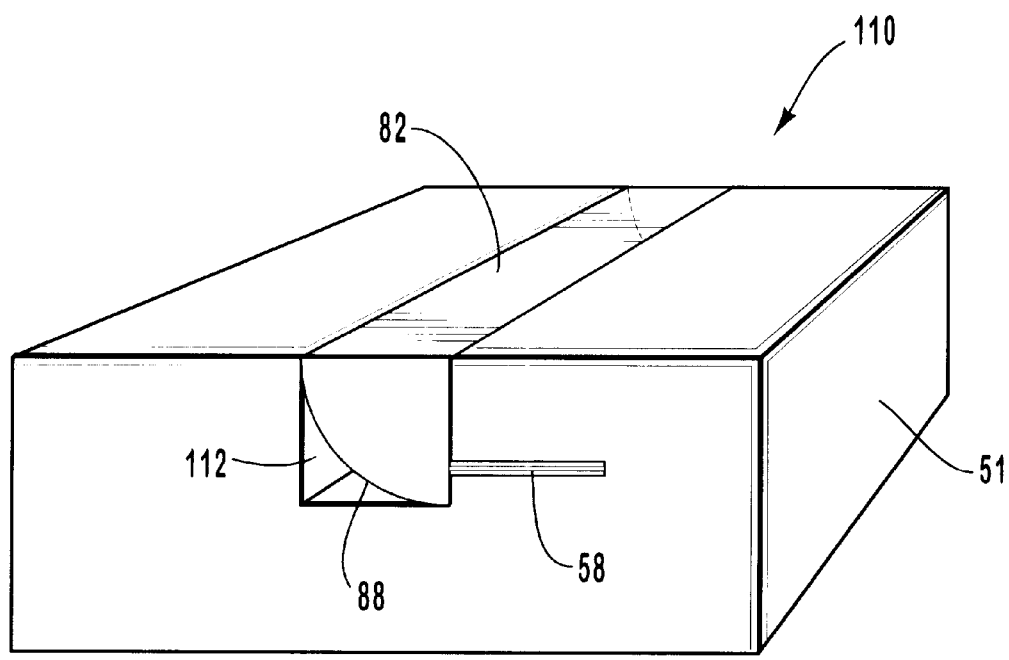
FIG. 14 is a perspective schematic view of a one-dimensional laser array device according to another embodiment of the present invention.

FIG. 14 depicts a one-dimensional laser array 110 in accordance with another embodiment of the present invention which includes similar features as laser array 80. Accordingly, laser array 110 includes a substrate 51 with a single groove 112 formed therein by conventional techniques. The groove 112 has a substantially rectangular profile defined by three sides. A laser beam emitter 58 is embedded in substrate 51 so that each facet of emitter 58 directs laser light into groove 112.

An elongated optical reflector member 82 is provided which is constructed to fit within groove 112 of substrate 54.

The reflector member 82 is formed as a solid piece of optics such as a microlens with three elongated sides as discussed above, including a curved sidewall 88 having a convex surface with a preferably hemiparabolic shape. The curved sidewall 88 is positioned within groove 112 such that the convex surface thereof faces away from each facet of emitter 58.

Figure 15:
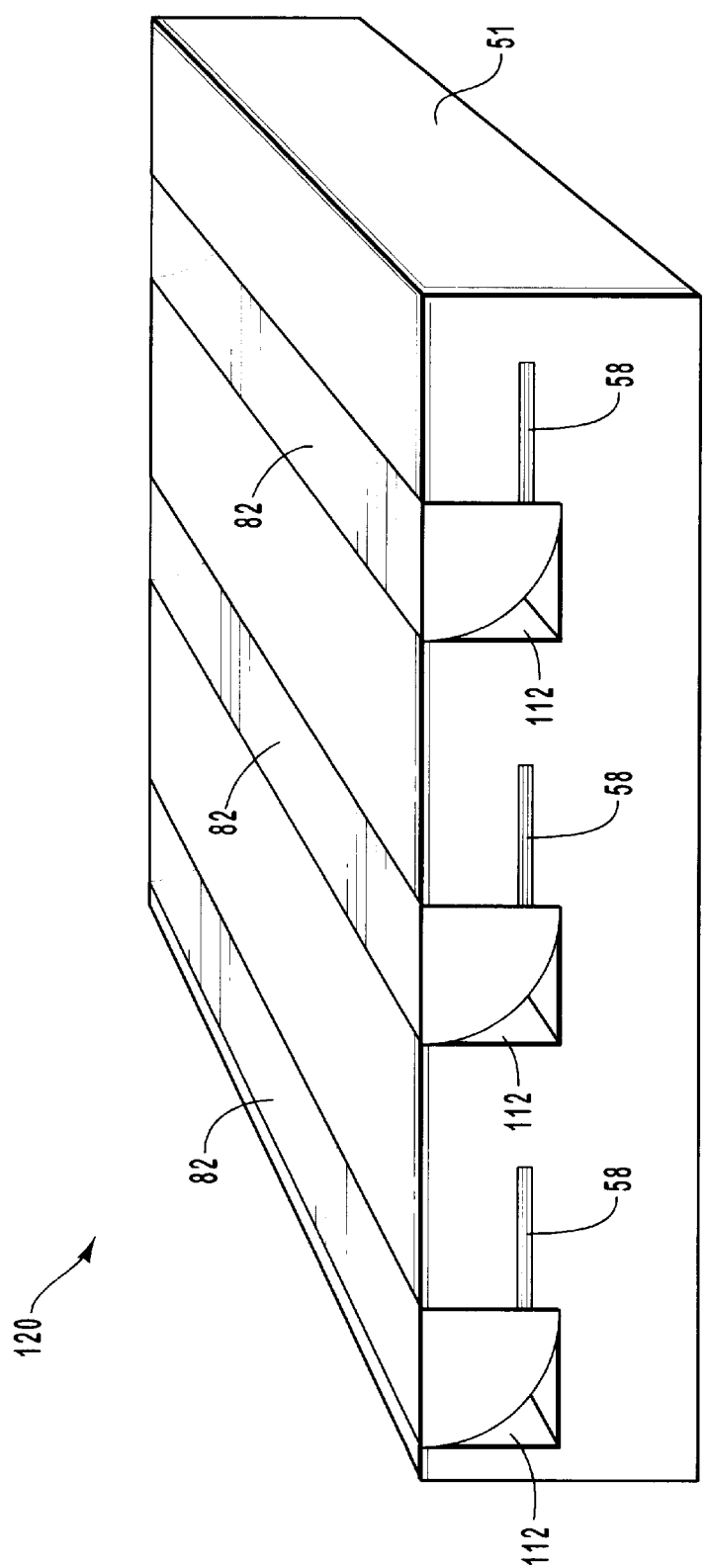
FIG. 15 is a perspective schematic view of a two-dimensional laser array device according to a further embodiment of the present invention.

FIG. 15 depicts a two-dimensional laser array 120 in accordance with another embodiment of the present invention that incorporates the features of laser array 110. Accordingly, laser array 120 is fabricated in the same manner as laser array 110, except that a plurality of grooves 112 are formed in substrate 51, with each groove 112 being in communication with a laser beam emitter 58.

An optical reflector member 82 is inserted into each groove 112 of substrate 51 as shown in FIG. 15. The highly reflective coating formed on the convex surface of the curved sidewalls of each reflector member 82 reflects laser light generated by emitters 58 into collimated rays or rays of other configurations as desired. The laser array 120 is fabricated such that one emitter 58 is disposed between a pair of adjacent inserted reflector members 82. The curved sidewalls of reflector members 82 face the same direction.

Figure 16A:
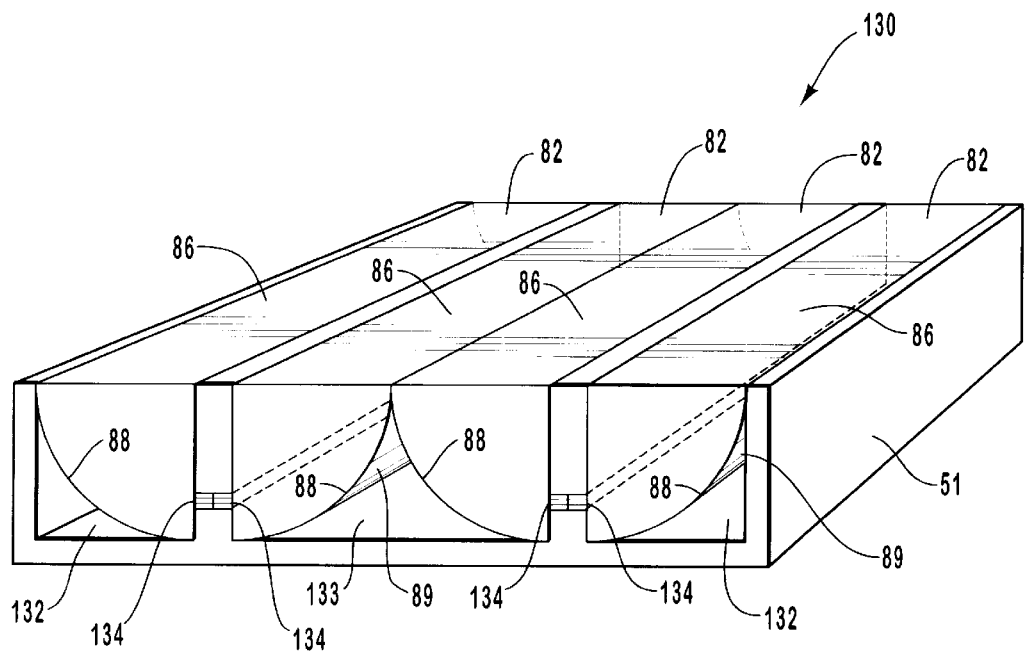
FIG. 16A is a perspective schematic view of a two-dimensional laser array device according to an alternative embodiment of the present invention.
Figure 16B:
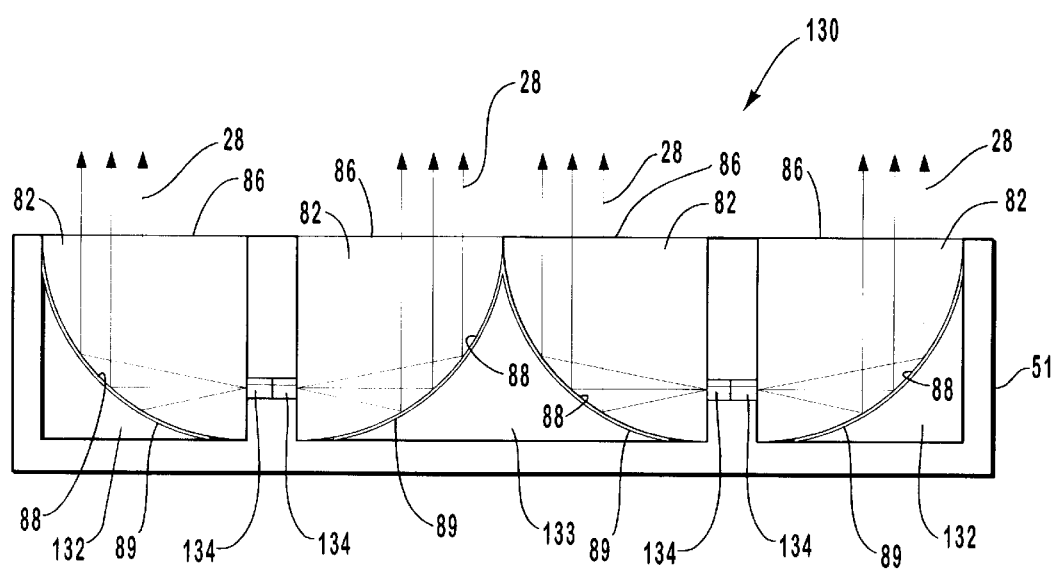
FIG. 16B is an end view of the laser array device of FIG. 16A.

FIGS. 16A and 16B depict a two-dimensional laser array 130 in accordance with an alternative embodiment of the invention that incorporates similar features as laser array 120. Accordingly, laser array 130 includes a plurality of reflector members 82 inserted into a plurality of grooves 132 and 133 formed in substrate 51, with each groove 132 or 133 being in communication with a laser beam emitter 134. Each groove 132 is sized to receive one reflector member 82, while the groove 133 is sized to receive two reflector members 82 in a back-to-back configuration as shown in FIGS. 16A and 16B. It should be understood that more than one groove 133 can be utilized in laser array 130 if desired. The highly reflective coating formed on the convex surface of the curved sidewalls of each reflector member 82 reflects laser light into collimated rays 28 as shown in FIG. 16B or rays of other configurations as desired.

The laser array 130 is fabricated such that each pair of emitters 134 are disposed in a back-to-back configuration between a pair of opposing reflector members 82, as depicted in FIGS. 16A and 16B. Thus, reflector members 82 are positioned in grooves 132 of substrate 51 such that the curved sidewalls 88 of reflector members 82 alternately face opposite directions.

As shown in FIG. 16B, during operation of laser array 130, laser light is emitted from each emitter 134 and into a corresponding reflector member 82, The laser light from each emitter 134 is reflected internally off of reflective layer 89 on each curved sidewall 88 and travels out through upper wall 86 of each reflector member 82 in the form of collimated rays 28. The collimated rays 28 can be directed through other optical devices (not shown) positioned just beyond reflector members 82 to focus the rays exiting reflector members 82.

It should be appreciated that the above embodiments of the laser arrays of the invention can be combined in a variety of configurations as desired to increase the size of the arrays and to produce three-dimensional laser configurations.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A laser device, comprising:
    a substrate having an upper surface with at least one groove formed therein;
    a laser beam emitter capable of emitting at least one laser beam, the emitter embedded in the substrate so as to emit at least one laser beam into the groove of the substrate; and
    a reflection means disposed in the groove for reflecting the at least one laser beam, the reflection means defining a parabolic reflective surface along the groove.

2. The laser device of claim 1, wherein the substrate comprises a material that permits dissipation of heat generated by the laser beam emitter.

3. The laser device of claim 2, wherein the substrate comprises a material selected from the group consisting of copper, beryllium oxide, aluminum nitride, and combinations thereof.

4. The laser device of claim 1, wherein the groove has a substantially hemiparabolic profile defined by a curved sidewall and a flat sidewall.

5. The laser device of claim 1, wherein the laser beam emitter comprises at least one diode laser bar.

6. The laser device of claim 1, wherein the laser beam emitter comprises at least one red diode laser bar.

7. The laser device of claim 1, wherein the laser beam emitter comprises at least one near infrared diode laser bar.

8. The laser device of claim 1, wherein the laser beam emitter is positioned in the substrate such that the laser beam will be directed at the reflective surface.

9. The laser device of claim 1, wherein the laser beam emitter is positioned in the substrate such that rays of the laser beam will be collimated upon reflection off of the reflective surface.

10. The laser device of claim 4, wherein the reflection means comprises a reflective layer on the curved sidewall of the groove.

11. The laser device of claim 10, wherein the reflective layer comprises a metallic material selected from the group consisting of aluminum, silver, nickel, copper, gold, and combinations thereof.

12. The laser device of claim 1, wherein the reflection means comprises an optical reflector member having a substantially hemiparabolic profile defined by a curved sidewall and a flat sidewall.

13. The laser device of claim 12, wherein the curved sidewall has a reflective layer formed thereon.

14. The laser device of claim 13, wherein the reflective layer comprises a metallic material selected from the group consisting of aluminum, silver, nickel, copper, gold, and combinations thereof.

15. The laser device of claim 12, wherein the flat sidewall has an antireflective layer formed thereon.

16. The laser device of claim 12, wherein the groove has a substantially rectangular profile.

17. A laser device, comprising:
    a substrate having an upper surface with a plurality of grooves formed therein, the grooves each having a substantially hemiparabolic profile defined by a curved sidewall and a flat sidewall;
    a plurality of laser diodes capable of emitting laser beams, the laser diodes embedded in the substrate so as to emit the laser beams into the grooves of the substrate and toward each curved sidewall; and a plurality of reflective layers formed on each curved sidewall of the grooves, the reflective layers each defining a parabolic reflective surface along each of the grooves for reflecting the laser beams.

18. The laser device of claim 17, wherein the substrate comprises a material selected from the group consisting of copper, beryllium oxide, aluminum nitride, and combinations thereof.

19. The laser device of claim 17, wherein the reflective layers comprise a metallic material selected from the group consisting of aluminum, silver, nickel, copper, gold, and combinations thereof.

20. The laser device of claim 17, wherein the laser diodes are embedded in a paired back-to-back configuration in the substrate.

21. A laser device, comprising:
a substrate having an upper surface with a plurality of grooves formed therein;
a plurality of laser diodes capable of emitting laser beams, the laser diodes embedded in the substrate so as to emit the laser beams into the grooves of the substrate; and
a plurality of optical reflector members inserted into the grooves for reflecting the laser beams, the optical reflector members each having a substantially hemiparabolic profile defined by a curved sidewall and a flat sidewall.

22. The laser device of claim 21, wherein the substrate comprises a material selected from the group consisting of copper, beryllium oxide, aluminum nitride, and combinations thereof.

23. The laser device of claim 21, wherein the curved sidewall of each optical reflector member has a reflective layer formed thereon.

24. The laser device of claim 23, wherein the reflective layer comprises a metallic material selected from the group consisting of aluminum, silver, nickel, copper, gold, and combinations thereof.

25. The laser device of claim 21, wherein the flat sidewall of each optical reflector member has an antireflective layer formed thereon.

26. The laser device of claim 21, wherein the optical reflector members are composed of glass or plastic materials.

27. The laser device of claim 21, wherein the grooves have a substantially rectangular profile.

28. The laser device of claim 21, wherein the laser diodes are embedded in a paired back-to-back configuration in the substrate.

29. A method of fabricating a laser device, comprising the steps of:
providing a substrate having an upper surface;
forming at least one groove in the upper surface of the substrate, the groove having a substantially hemiparabolic profile defined by a curved sidewall and a flat sidewall;
embedding at least one laser beam emitter in the substrate capable of emitting at least one laser beam into the groove of the substrate; and
forming a reflective layer on the curved sidewall of the groove, the reflective layer defining a parabolic reflective surface along the groove.

30. The method of claim 29, wherein the laser beam emitter is positioned in the substrate such that the laser beam will be directed at the reflective surface.

31. The method of claim 29, wherein the at least one groove includes a plurality of grooves formed in the upper surface of the substrate.

32. The method of claim 29, wherein the at least one laser beam emitter includes a plurality of laser diodes embedded in a paired back-to-back configuration in the substrate.

33. A method of fabricating a laser device, comprising the steps of:
providing a substrate having an upper surface;
forming at least one groove in the upper surface of the substrate;
embedding at least one laser beam emitter in the substrate capable of emitting at least one laser beam into the groove of the substrate;
forming at least one optical reflector member having a substantially hemiparabolic profile defined by a curved sidewall and a flat sidewall; and
placing the optical reflector member in the groove such that the flat sidewall abuts against the laser beam emitter.

34. The method of claim 33, wherein a reflective layer is formed on the curved sidewall of the optical reflector member.

35. The method of claim 33, wherein an antireflective layer is formed on the flat sidewall of the optical reflector member.

36. The method of claim 33, wherein the at least one groove includes a plurality of grooves formed in the upper surface of the substrate.

37. The method of claim 33, wherein the at least one laser beam emitter includes a plurality of laser diodes embedded in a paired back-to-back configuration in the substrate.

38. An apparatus for improving the quality and power of a laser beam, comprising:
an optical reflector member comprising a light transmissive material and having a reflective surface, the reflector member having a substantially hemiparabolic curvature along the reflective surface and a focal line corresponding to the hemiparabolic curvature; and
a laser beam emitter capable of emitting at least one laser beam, the laser beam emitter being positioned in relation to the focal line of the reflective surface such that the laser beam is reflected off of the reflective surface.

39. The apparatus of claim 38, wherein the laser beam emitter comprises at least one diode laser bar.

40. The apparatus of claim 38, wherein the laser beam emitter comprises at least one red diode laser bar.

41. The apparatus of claim 38, wherein the laser beam emitter comprises at least one near infrared diode laser bar.

42. The apparatus of claim 38, wherein the laser beam emitter comprises a diode laser bar or array made of individual diode lasers that have been detachably assembled together.

43. The apparatus of claim 38, further comprising an outer base supporting the reflector, the outer base comprising a material that permits dissipation of heat generated by the laser beam emitter.

44. The apparatus of claim 43, wherein the material is selected from the group consisting of copper, beryllium oxide, aluminum nitride, and combinations thereof.

45. The apparatus of claim 43, wherein the laser beam emitter is positioned on the outer base adjacent to the reflector.

46. The apparatus of claim 38, wherein the light transmissive material comprises a glass or plastic material.

47. The apparatus of claim 38, wherein the optical reflector member has a substantially hemiparabolic profile defined by a curved sidewall and a pair of flat sidewalls.

48. The apparatus of claim 47, wherein the curved sidewall has a reflective layer formed thereon.

49. The apparatus of claim 38, wherein the laser beam is collimated upon reflection off of the reflective surface.

50. The apparatus of claim 38, wherein the reflective surface comprises a material selected from the group consisting of aluminum, silver, nickel, copper, gold, and combinations thereof.

51. The apparatus of claim 38, further comprising at least one lens outside of the reflector member in the path of the laser beam reflected off the reflective surface.

52. The apparatus of claim 38, further comprising at least one mirror outside of the reflector member in the path of the laser beam reflected off the reflective surface.

53. The apparatus of claim 38, further comprising at least one non-linear crystal outside of the reflector member in the path of the laser beam reflected off the reflective surface.

54. The apparatus of claim 53, wherein the non-linear crystal comprises a material selected from the group consisting of lithium tantalate, lithium niobate, and potassium titanyl phosphate.

55. An apparatus for improving the quality and power of a laser beam comprising an optical reflector member comprised of a light transmissive material and having a reflective surface, the reflector member having a hemiparabolic curvature along the reflective surface and a focal line corresponding to the hemiparabolic curvature such that a laser beam emitted from a diode laser or an array of diode lasers positioned at the focal line is reflected off of the reflective surface of the reflector member as a collimated beam.

56. The apparatus of claim 55, wherein the light transmissive material comprises a glass or plastic material.

57. The apparatus of claim 55, wherein the optical reflector member has a substantially hemiparabolic profile defined by a curved sidewall and a pair of flat sidewalls.

58. The apparatus of claim 57, wherein the curved sidewall has a reflective layer formed thereon.

59. A method of fabricating a laser device, comprising the steps of:

forming an elongated reflector with a reflective surface, the elongated reflector having a hemiparabolic curvature along the reflective surface and a focal line corresponding to the hemiparabolic curvature, the elongated reflector formed of a light transmissive material;

assembling together individual diode lasers to form a laser bar or array; and positioning the laser bar or array in relation to the focal line of the reflective surface such that a laser beam is reflected off of the reflective surface as a collimated beam.

60. The method of claim 59, wherein the light transmissive material comprises a glass or plastic material.

61. The method of claim 59, wherein the reflective surface is formed by depositing a reflective layer on a curved sidewall of the elongated reflector.

62. A laser device, comprising:

a substrate having an upper surface with at least one groove therein;

a laser beam emitter capable of emitting at least one laser beam, the emitter embedded in the substrate so as to emit at least one laser beam into the groove of the substrate; and a reflection means disposed in the groove for reflecting the at least one laser beam, the reflection means defining a parabolic reflective surface along the groove and comprising an optical reflector member having a substantially hemiparabolic profile defined by a curved sidewall and a flat sidewall.

63. A laser device, comprising:

a substrate having an upper surface with a plurality of grooves therein, the grooves each having a substantially hemiparabolic profile defined by a curved sidewall and a flat sidewall, the substrate comprising a material selected from the group consisting of copper, beryllium oxide, aluminum nitride, and combinations thereof;

a plurality of laser diodes capable of emitting laser beams, the laser diodes embedded in the substrate so as to emit the laser beams into the grooves of the substrate and toward each curved sidewall; and a plurality of reflective layers on each curved sidewall of the grooves, the reflective layers each defining a parabolic reflective surface along each of the grooves for reflecting the laser beams.

64. A method of fabricating a laser device, comprising the steps of providing a substrate having an upper surface, the substrate comprising a material selected from the group consisting of copper, beryllium oxide, aluminum nitride, and combinations thereof;

forming at least one groove in the upper surface of the substrate, the groove having a substantially hemiparabolic profile defined by a curved sidewall and a flat sidewall;

embedding at least one laser beam emitter in the substrate capable of emitting at least one laser beam into the groove of the substrate; and forming a reflective layer on the curved sidewall of the groove, the reflective layer defining a parabolic reflective surface along the groove.

65. An apparatus for improving the quality and power of a laser beam, comprising:

an elongated reflector having a reflective surface, the elongated reflector having a substantially hemiparabolic curvature along the reflective surface and a focal line corresponding to the hemiparabolic curvature;

an outer base supporting the reflector, the outer base comprising a material that permits dissipation of heat generated by the laser beam emitter, the material selected from the group consisting of copper, beryllium oxide, aluminum nitride, and combinations thereof; and a laser beam emitter capable of emitting at least one laser beam, the laser beam emitter being positioned in relation to the focal line of the reflective surface such that the laser beam is reflected off of the reflective surface.

* * * * *